(12) United States Patent
Ingalls et al.

(10) Patent No.: US 9,715,919 B1
(45) Date of Patent: Jul. 25, 2017

(54) ARRAY DATA BIT INVERSION

(71) Applicant: Micron Technology, Inc., Boise, ID (US)

(72) Inventors: Charles L. Ingalls, Meridian, ID (US); Scott J. Derner, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/188,890

(22) Filed: Jun. 21, 2016

(51) Int. Cl.
*G11C 11/22* (2006.01)

(52) U.S. Cl.
CPC ........ *G11C 11/2273* (2013.01); *G11C 11/221* (2013.01); *G11C 11/2275* (2013.01)

(58) Field of Classification Search
CPC ........... G11C 11/22; G11C 7/14; G11C 29/50; G11C 11/5657; G11C 7/06; G11C 2207/2227; G11C 8/18; G11C 8/20; G11C 2211/4013; G11C 7/18; G11C 7/02; G11C 7/062; G11C 11/4091; G11C 11/4094; G11C 7/12; G11C 13/0014; G11C 13/0016; G11C 11/16; G11C 11/2275; G11C 11/5664; G11C 13/0004; G11C 13/0009; G11C 13/0033; G11C 13/0069; G11C 16/3431

USPC ...... 365/145, 149, 189.09, 117, 189.07, 200, 365/210.12, 230.06, 189.15, 189.16, 203, 365/65, 189.05, 210.13, 222, 201, 151, 365/208, 207, 158, 171, 205, 148, 154, 365/157, 173, 185.25, 202, 210.14
See application file for complete search history.

(56) References Cited

U.S. PATENT DOCUMENTS

2006/0077740 A1* 4/2006 Lee .................. G11C 7/14
365/145

\* cited by examiner

*Primary Examiner* — Thong Q Le
(74) *Attorney, Agent, or Firm* — Holland & Hart LLP

(57) ABSTRACT

Methods, systems, and apparatuses for memory array bit inversion are described. A memory cell (e.g., a ferroelectric memory cell) may be written with a charge associated with a logic state that may be the inverse of the intended logic state of the cell. That is, the actual logic state of one or more memory cells may be inverted, but the intended logic state of the memory cells may remain unchanged. Different sets of transistors may be configured around a sense component of a cell to enable reading and writing of intended and inverted logic states from or to the cell. For instance, a first set of transistors may be used to read the logic state currently stored at a memory cell, while a second set of transistors may be used to read a logic state inverted from the currently stored logic state.

23 Claims, 11 Drawing Sheets

ARRAY DATA BIT INVERSION

BACKGROUND

The following relates generally to memory devices and more specifically to maintaining the performance of ferroelectric memory cells that store logic values for extended periods of time.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A ferroelectric memory cell of the FeRAM device may store a logic state (e.g., logic 1) for an extended period of time (e.g., hours, days, months, etc.). Over this period of time, ferroelectric domains within a ferroelectric capacitor of the ferroelectric memory cell may shift, the magnitude and effects of which may increase with time. As a result of this shifting, the ferroelectric memory cell may experience degraded performance during subsequent write or read operations.

BRIEF DESCRIPTION OF THE DRAWINGS

The disclosure herein refers to and includes the following figures.

DETAILED DESCRIPTION

Figure 1:
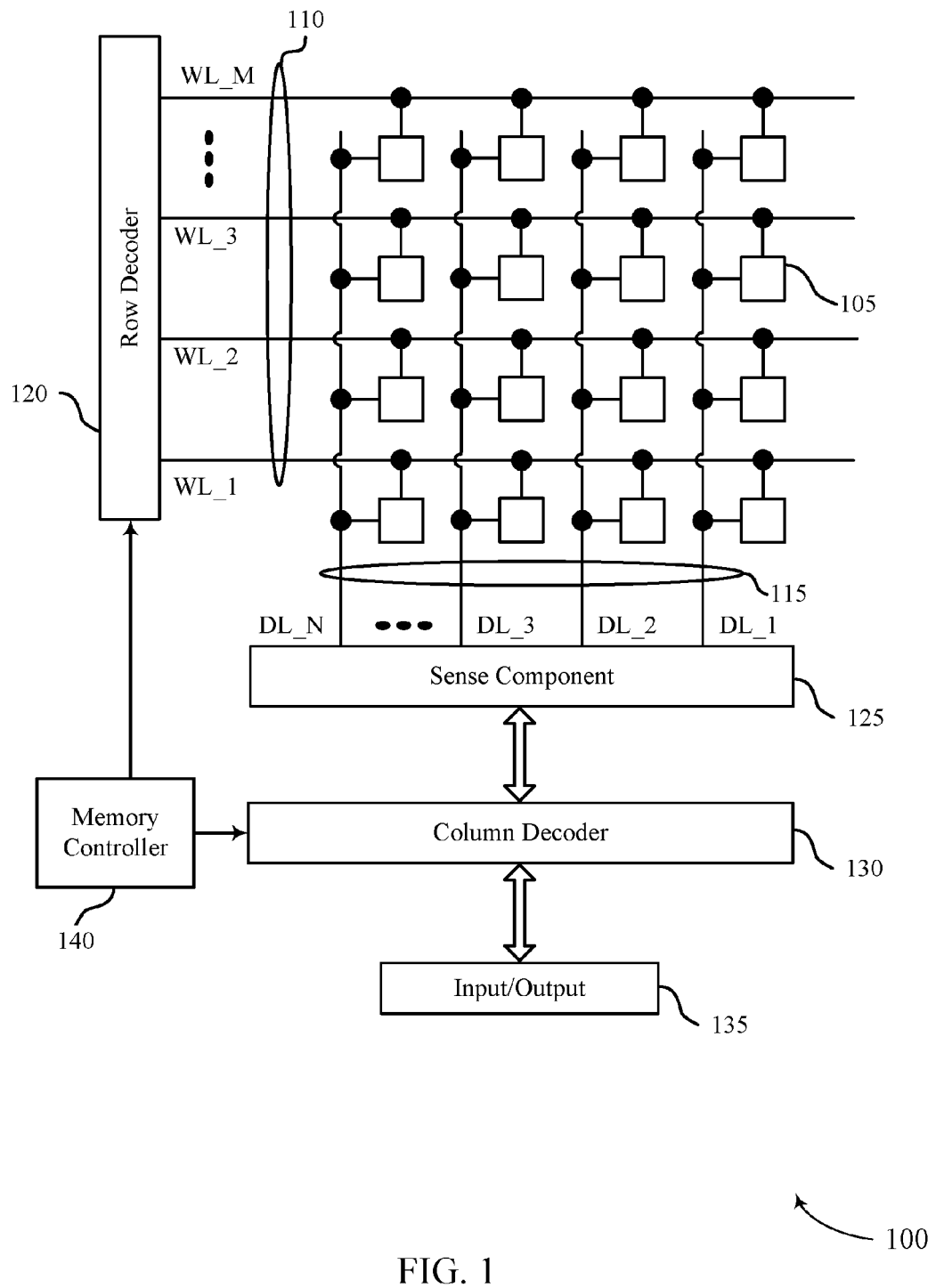
FIG. 1 illustrates an example memory array that supports the inversion of data bits in accordance with various embodiments of the present disclosure.

A memory cell, such as a ferroelectric memory cell, may be written with a charge associated with one logic state (an intended logic state), and then the cell may be re-written with a charge associated with a different, inverted logic state. This logic state inversion (or bit inversion) may counter effects on the cell due to storing the same logic state for extended periods of time; and despite storing the inverted logic state, the cell may be read to have the intended logic state. In other words, the charge stored in the cell may be changed in order to mitigate shifting ferroelectric domains, but the logic value that is understood to be stored in the cell may remain unchanged.

For example, a cell that has stored a charge associated with an intended logic state (e.g., logic 1) for a time period may be re-written to store a different charge associated with an inverted logic state (e.g., logic 0). And a subsequent read operation performed on the re-written cell may still result in the intended logic state (logic 1), being read; this may occur despite the cell actually storing the different charge associated with the inverted logic state.

In some cases, additional logic may be implemented so that the intended logic state may be read from the cell and so that the proper logic state (e.g., the intended logic state or the inverted logic state) may be written to the cell. For instance, an indicator may be associated with the cell, and a value of the indicator may be used to indicate whether the logic state stored by the cell is the intended logic state or the inverted logic state. The intended logic state may correspond to the originally stored logic state or the logic state that is intended to be read from the memory cell. The inverted logic state may be a logic state that is opposite the intended logic state.

The value of an indicator of the intended or inverted logic state may be provided to sensing components in a memory array to enable proper reading from or writing to the cell. For example, the value may be provided to a sense component that is associated with a cell storing an inverted logic state and may trigger the sense component to change an output resulting from a sensing operation of the cell. In such cases, the read logic state is different than the sensed or actual logic state. In another example, the indicator may be provided to error correcting code (ECC) logic which may modify a codeword based on the indicator in order to validate logic states read from a number of cells.

In some cases, the additional logic used to read the originally stored or intended logic state may be implemented in a manner that is not communicated to the other sensing components. That is, a value indicating whether an intended or different logic state being stored by the cell may not be provided to the sense component or to the ECC logic. In some examples, a first and second set of transistors may be configured around a sense component such that the first set of transistors, which may be referred to as "true transistors," may be used to read or write a true logic state from or to the cell—e.g., if the read logic state is the same as the stored logic state. And the second set of transistors, which may be referred to as the "inverting transistors," may be used to read or write a different logic state from the logic state stored by or intended for the cell—e.g., the read logic state is the opposite of the stored logic state. The true transistors or the inverting transistors may be activated based on whether the intended logic state or an inverted logic state is stored by or is to be written to the cell. So whether a cell is accessed through the true transistors or the inverting transistors may depend on whether the cell is presently storing the intended or inverted state.

In some cases, the true transistors may be used to read and write-back the logic state stored by the cell if the logic state is the intended logic state, while the inverting transistors may be used to read and write-back the logic state stored by the cell if the logic state is the inverted logic state. In this way, the sense component (e.g., a sense amplifier) may generate a voltage corresponding to the intended logic state based on the signals that are sensed at the inputs of the sense component without having to determine whether or not to change the resulting voltage to reflect the intended logic state. In some examples, a logic state stored by the cell may be read using the true transistors and the inverted logic state may be written-back to the cell using the inverting transistors. So the inverted logic state may be re-written to the cell without a sense component having to change the voltage resulting from the sensing operation to a different voltage.

In some examples, a counter may be used to determine which of the first set of transistors and the second set of transistors to use for a read or write operation. For instance, the logic states stored by cells of an array may be sequentially inverted and a value of a counter may be concurrently updated with the inversion to reflect the address of the last cell to be updated. The value of the counter may be used to determine whether a cell that is to be accessed (e.g., read or written) is expected to be storing an intended logic state or an inverted logic state. For instance, an address associated with the value of the counter may be compared with an address of the cell that is to be accessed.

In some cases, if the address of the cell is less than or equal to the address associated with the counter value, it may be determined that the cell is storing an inverted logic state (i.e., the cell has been re-written). Conversely, if the address of the cell is greater than the address associated with the counter value, it may be determined that the cell is storing an intended logic state (i.e., the cell has not been re-written). Accordingly, for a write operation to a cell that is expected to be storing an inverted state of an intended logic state, the inverting transistors may be used to write the inverted logic state to the cell instead. Thus, a subsequent read operation using the inverting transistors will yield the intended logic state.

Features of the disclosure introduced above are further described below in the context of a memory array. Specific examples are then described for an example circuit and operation of the circuit. These and other features of the disclosure are further illustrated by and described with reference to apparatus diagrams, system diagrams, and flowcharts that relate to the inversion of data bits.

FIG. 1 illustrates an example memory array 100 that supports the inversion of data bits in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively.

DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below. Ferroelectric materials may also be susceptible to imprinting, which may occur with ferroelectric domains drift due to extended exposure to or storage of the same charge. The techniques described herein may counter imprinting without significantly altering the beneficial aspects of employing ferroelectrics in memory arrays.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a the voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

For instance, ferroelectric memory cells 105 may retain a stored state for longer periods of time relative to a DRAM memory cell (e.g., hours, days, months, etc.), which may reduce or eliminate the need for refresh operations. Over time however, a ferroelectric memory cell 105 storing a logic state for an extended period (e.g., hours, days, months, etc.) may experience a shifting of ferroelectric domains within an associated ferroelectric capacitor. This imprint may negatively affect subsequent read and write operations from and to the ferroelectric memory cell 105. For instance, writing a logic state to the ferroelectric memory cell 105 that is opposite to a logic state stored for an extended period of time, may result in a "soft write" condition as will be described in more detail below. A soft write may result in a degraded read operation, which may be characterized by a decreased sensing window for the ferroelectric memory cell. In some cases, the extended period of time discussed above may not necessarily be associated with a set period of time such as a day, month, or longer, but may instead be associated with the time between storing a logic value and a subsequent point in time at which increased read/write errors may occur or are expected to occur.

Accordingly, memory cells 105 of memory array 100 may be written with different logic states to maintain reliability of the ferroelectric memory cell—e.g., reducing a bit error rate, write errors, etc. In some examples, memory array 100 may periodically write each ferroelectric memory cell 105 of the memory array 100 or of a subsection of the memory array 100 with a logic state opposite the currently stored logic state (e.g., the inverted logic state) and opposite the logic state intended to be read from the ferroelectric memory cell. For instance, the memory controller 140 may identify a time period (e.g., a time period that corresponds to a point in time at which the expected sensing window falls below a threshold value after storing an initial value) and may update one or more ferroelectric memory cells 105 of the memory array 100 according to the identified period of time. In some cases, the time period may be determined based on internal characteristics of the ferroelectric memory cells 105, a temperature of the memory array 100, an age of the ferroelectric memory cells 105, a sensing window resulting from reading the ferroelectric memory cells 105, or the like.

Additional logic may be used to invert a logic state of a memory cell so that the memory controller 140 (or another components of or using the memory array 100) is aware which ferroelectric memory cells 105 are storing intended logic states and which ferroelectric memory cells 105 are storing inverted logic states. In some examples, one or more indicators may be associated with one or more memory and values of the indicators may be used to indicate whether the memory cells are storing intended or inverted logic states.

By way of example, a value of "0" may indicate that the intended logic state is stored, while a value "1" may indicate that the inverted logic state is stored. This value may be provided to sense component 125, which may use the value to maintain or invert a voltage generated by the sense component 125 after performing a sensing operation. For instance, if a memory cell 105 is storing an inverted logic state 0, a negative voltage may be generated across the sense component 125, where the positive terminal is associated with the digit line 115 and the negative terminal is associated with the reference line (i.e., the digit line 115 may be at a lower voltage than the reference line), after a sense operation is performed. The sense component 125 may then invert the voltage so that a positive voltage, corresponding to an intended logic state 1, is applied across the sense component based on receiving a value "1" from the indicator.

In some case, processing the indicator value at the sense component 125 to determine the proper voltage to output—e.g., the voltage corresponding to the intended or inverted logic state—may result in increased latency, undesirable modifications to the sense component, or an increased likelihood of error in a read operation. For example, the sense component 125 may be modified from other architectures to accommodate the indicator value, and at times the indicator value may be incorrect. Furthermore, if ECC logic is used, similar modifications may be needed to accommodate the indicator value. In order to avoid physical or operational modifications to sensing components, such as sense component 125 or ECC logic, additional components may be placed around the sense component 125 such that the sense component may output the intended or inverted logic states with no or little additional processing. For example, a first set of transistors, or "true transistors," may be used to read the logic state currently stored by a ferroelectric memory cell 105 and a second set of transistors, or "inverting transistors," may be used to read a logic state opposite than that stored by the ferroelectric memory cell 105. The true and inverting transistors may be strategically activated for access operations based on whether or not an intended logic state is stored by the ferroelectric memory cell 105. In some examples, activating the true and inverting transistors is based on an address associated with the ferroelectric memory cell 105 and a value of a counter used to indicate an address of the last group of memory cells that is storing inverted logic state.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, the memory controller 140 may be used to maintain the performance of a ferroelectric memory cell 105. For example, memory controller 140 may be used to activate either the true transistors or the inverting transistors when accessing one or more ferroelectric memory cells 105. In some examples, the memory controller 140 may activate the true transistors to read a logic state stored by the ferroelectric memory cells 105, and may subsequently activate the inverting transistors to write the opposite logic state to the ferroelectric memory cells 105. In this way, the memory controller 140 may invert a logic state stored by a ferroelectric memory cell 105, so that the inverted logic state may be written-back to and stored by the ferroelectric memory cell 105, or in other cases, so that the intended logic state may be written-back to and stored by a ferroelectric memory cell 105 currently storing an inverted logic state.

The memory controller 140 may also update a value of a counter when the logic states of a group of ferroelectric memory cells 105 is inverted. The value of the counter may be associated with an address corresponding to the ferroelectric memory cells. When reading or writing to a group of ferroelectric memory cells 105, the memory controller 140 may compare the address corresponding to the group of ferroelectric memory cells 105 with an address associated with the value of the counter to determine whether the true transistors or the inverting transistors are to be activated.

In some examples, the address of the accessed ferroelectric memory cells 105 being less than the address associated with the counter is indicative of the ferroelectric memory cells 105 storing inverted logic states, and that the inverting transistors should be used. In this way, the memory controller 140 may read the intended logic state from the ferroelectric memory cells 105. Additionally, the memory controller 140 may write the proper logic state to the ferroelectric memory cells 105 based on the state of the ferroelectric memory cells 105—e.g., may write an inverted logic state to a ferroelectric memory cell 105 in place of the intended logic state if the ferroelectric memory cell 105 is expected to be storing an inverted logic state.

Figure 2:
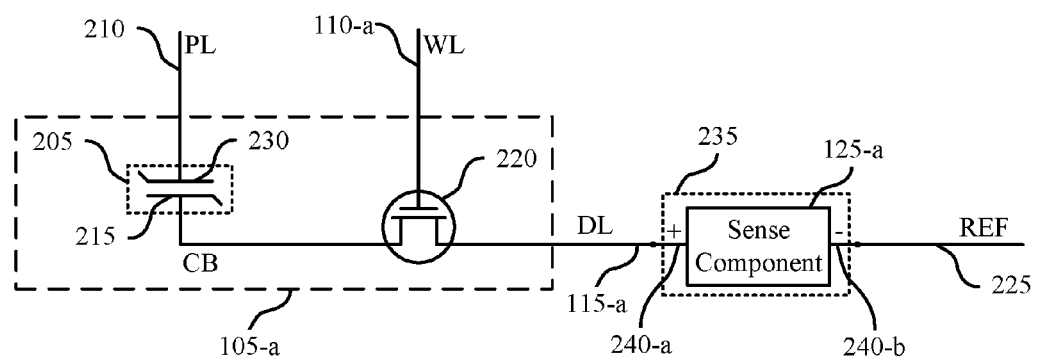
FIG. 2 illustrates an example circuit that supports the inversion of data bits in accordance with various embodiments of the present disclosure.

FIG. 2 illustrates an example circuit 200 that supports the inversion of data bits in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be exchanged without changing the operation of memory cell 105-a. Circuit 200 also includes selection component 220 and reference line 225. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of femtofarads (fF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

In some examples, if memory cell 105-a stores a logic state for an extended period of time—e.g., stores an initial logic state for a period of time without being accessed—the ferroelectric dipoles or domains within capacitor 205 may begin to reorder or shift. The shift in ferroelectric domains may result in a failed write operation when the opposite logic state is written to the capacitor 205. This shifting may further result in a failed read operation when sensing the logic state stored by capacitor 205. Accordingly, the logic state stored by memory cell 105-a may be periodically written with the opposite logic state to mitigate the reordering of ferroelectric domains within capacitor 205; this process may be referred to as flipping or inverting the bit stored in memory cell 105-a. In the following discussion the terms "flipping" (or "flipped") and "inverting" (or "inverted") may be used interchangeably. As discussed below, additional logic may be used to read the intended bit value of a memory cell 105-a storing a flipped bit. The time period that results in domains shifting may vary with ferroelectric material employed or with different implementations. Time periods on the order of seconds, minutes, hours, days, etc. may cause a shift in various scenarios.

In some cases, the sense component 125-a may have two input lines 240 and a designated polarity. For example, first input line 240-a of sense component 125-a may be designated as the positive terminal and second input line 240-b of sense component 125-a may be designated as the negative terminal. The sense component 125-a and the corresponding input lines 240 may be encompassed by what is referred to as the sense component "gut" 235. The sense component gut 235 may delineate the points at which the sense component 125-a is inserted into circuit 200, and a point at which sense component 125-a may be isolated from the circuit 200. Sense component 125-a may be placed within circuit 200 so that first input line 240-a is in electronic communication with digit line 115-a and so that second input line 240-b is in electronic communication with reference line 225. In one example, to write a logic state 0, sense component 125-a may drive digit line 115-a to a virtual ground via first input line 240-a and may drive reference line 225 to a higher voltage via second input line 240-b, while plate line 210 is driven to a higher voltage (writing the logic 0) and then to virtual ground (removing the voltage across the capacitor).

In some cases, sense component 125-a may be reconfigured to flip the polarity relative to circuit 200—e.g., so that first input line 240-a is in electronic communication with reference line 225 and second input line 240-b is in electronic communication with digit line 115-a. Sense component 125-a may then be directed to write a logic state 0. In such cases, the digit line 115-a may be driven to a higher voltage via second input line 240-b, while plate line 210 is driven to a higher voltage (removing the voltage across the capacitor) and then to virtual ground (writing a logic 1), so that the inverted logic state may be written to ferroelectric memory cell 105-a. Multiple sets of transistors may be used to implement this polarity switching to enable the writing of a logic state to ferroelectric memory cell 105-*a* that is different than a logic state provided to sense component 125-*a*. For instance, a first set of transistors (the "true transistors") may maintain the original configuration, while the second set of transistors (the "inverting transistors") may switch the configuration.

Figure 3:
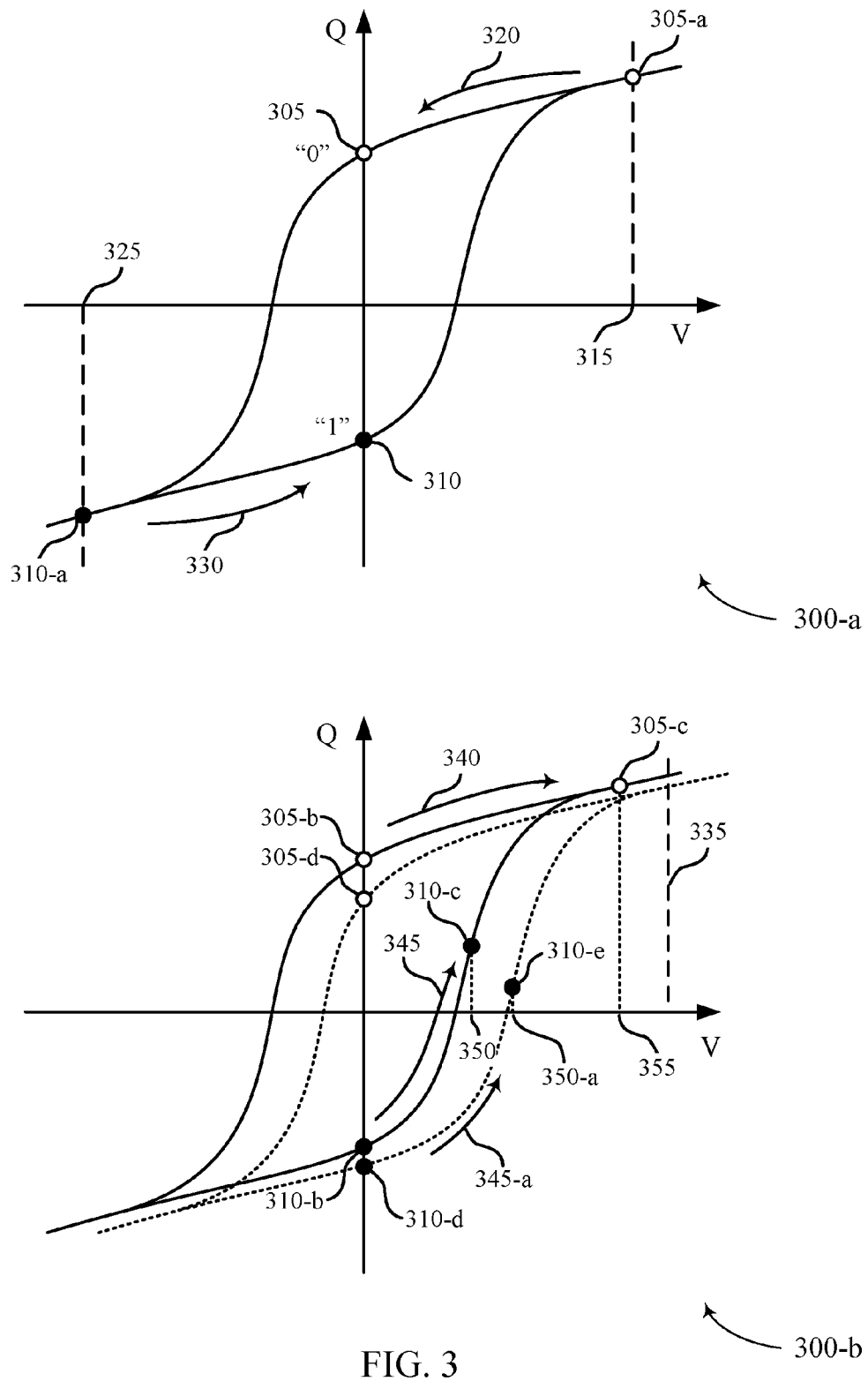
FIG. 3 illustrates example hysteresis plots for a ferroelectric memory cell that is operated in accordance with various embodiments of the present disclosure.

FIG. 3 illustrates examples of non-linear properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied to the capacitor. In response, the stored charge, Q, changes and the degree of the change depends on the initial charge state—i.e., the final stored charge (Q) may depend on whether charge state 305-*b* or 310-*b* was initially stored. For example, hysteresis curve 300-*b* illustrates two possible stored charge states 305-*b* and 310-*b*. Voltage 335 may be applied to a capacitor cell plate—e.g., cell plate 230 with reference to FIG. 2. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335−voltage 350) or (voltage 335−voltage 355). A reference voltage may be generated so that its magnitude is between the two possible digit line voltages in order to determine the stored logic state—i.e., to determine whether the digit line voltage is higher or lower than the reference voltage. For example, the reference voltage may be an average of the two quantities, (voltage 335−voltage 350) and (voltage 335−voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state when the cell is read. A ferroelectric memory cell, however, may maintain the initial logic state after a read operation. For example, if charge state 310-*b* is stored, the charge state may follow path 345 to charge state 310-*c* during a read operation and after applying voltage 350. In some cases, reading a ferroelectric memory cell may disturb the logic state of the cell. For instance, charge state 310-*b* may no longer be stored after reading the ferroelectric memory cell. Therefore, a write-back procedure may be performed. In such cases, the write-back procedure may involve application of a voltage to restore the charge of the cell to its initial charge state 310-*b*.

A ferroelectric capacitor operating under an imprint condition (i.e., an imprinted cell) may follow an alternative path 345-*a*. The alternative path 345-*a* may be associated with a charge state 310-*e*, which is less than charge state 310-*c*, and a voltage 350-*a* across the capacitor, which is greater than 350. Therefore, the resulting voltage of the digit line (voltage 335–voltage 350-*a*) may be smaller than the voltage of the digit line 115 associated with voltage 350. Additionally, the remnant polarization (e.g., as measured between charge state 305-*d* and charge state 310-*d*) may decrease with fatigue. As a result, the difference between the resulting voltage of the digit line, (voltage 335–voltage 350-*a*) and (voltage 335–voltage 355), may also be smaller, which may yield a smaller sensing window and increased number of read errors. The change in the path followed by a ferroelectric capacitor may increase over time and may be referred to as drift. Writing an opposite logic state to an imprinted ferroelectric capacitor may result in or be referred to as a soft write. A soft write may be associated with a lower charge state being stored by the ferroelectric capacitor, such as charge state 305-*d*, and as a result the ferroelectric capacitor may share a smaller amount of charge with an associated digit line. Accordingly, the sensing window of a subsequent read operation may also be reduced.

In some examples, a logic state different than (e.g., opposite) the logic state currently being stored by the ferroelectric capacitor may be written to the ferroelectric capacitor at configured intervals. This may minimize the amount of drift that occurs between storing a logic value by a ferroelectric capacitor and reading the logic state stored by the ferroelectric capacitor. In some examples, if the ferroelectric capacitor stores a first charge state, such as charge state 310-*b*, for a determined period of time without being accessed, the opposite charge state (e.g., charge state 305-*b*) may be written to the ferroelectric capacitor. Over time, if the ferroelectric capacitor is still not accessed, the hysteresis curve may shift in the opposite direction. After a second period of time, the initial charge state 310-*b* may be written back to the ferroelectric capacitor. In this way, the magnitude of drift may be decreased and the effects of imprint may be mitigated. However, the memory array may still read the intended logic state from the ferroelectric capacitor, despite the ferroelectric capacitor storing an opposite logic state.

Multiple sets of transistors may be used for writing back an opposite logic state and for reading an intended logic state from a ferroelectric memory cell. For instance a first set of transistors may be configured around a sense component to enable the reading/writing of the true logic states from/to a ferroelectric memory cell. And a second set of transistors may be configured around a sense component for reading an intended logic state from a ferroelectric capacitor storing an inverted logic state. Additionally, the second set of transistors may be used to write an inverted logic state to a ferroelectric memory cell that is expected to be storing an inverted logic state.

Figure 4A:
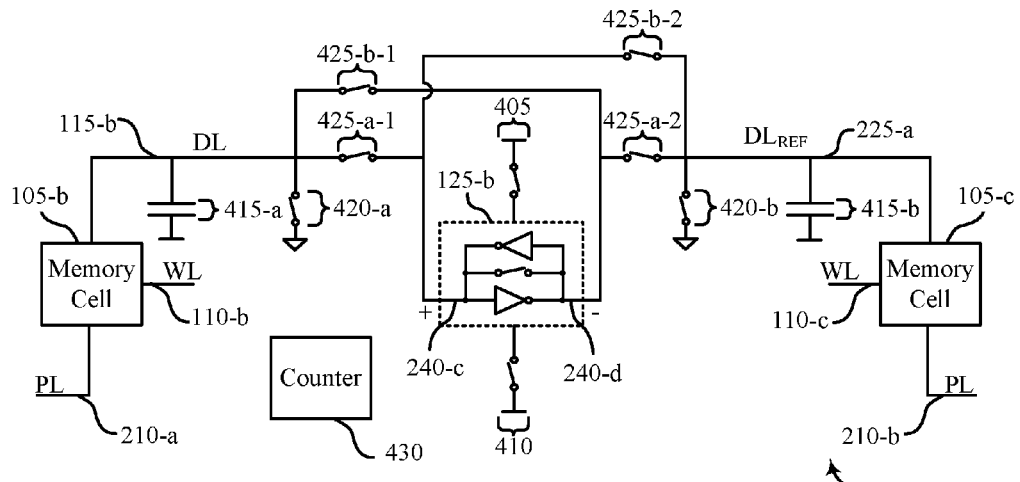
FIGS. 4A-4C illustrate aspects of an example circuit that supports the inversion of data bits in accordance with various embodiments of the present disclosure.

FIG. 4A illustrates an example circuit 400-*a* that supports the inversion of data bits in accordance with various embodiments of the present disclosure. Circuit 400-*a* includes memory cells 105-*b* and 105-*c*, word line 110-*b* (which may also be referred to as an access line), digit line 115-*b*, and sense component 125-*b*, which may be examples of a memory cell 105, word line 110, digit line 115, and sense component 125, respectively, described with reference to FIGS. 1 and 2. Memory cells 105-*b* and 105-*c* may include a ferroelectric capacitor that operates with characteristics as described with reference to FIG. 3. Circuit 400-*a* also includes plate line 210-*a* and reference line 225-*a*, which may be examples of plate line 210 and reference line 225, respectively, described with reference to FIG. 2. Circuit 400-*a* also includes voltage source 405, voltage source 410, equalization switches 420-*a* and 420-*b*, and isolation components 425-*a* and 425-*b*. Equalization switches 420 and isolation components 425 may also be generally referred to as switching components.

Digit line 115-*b* and reference line 225-*a* may have intrinsic capacitances 415-*a* and 415-*b*, respectively. Intrinsic capacitances 415-*a* and 415-*b* may not be electrical devices—i.e., they may not be two-terminal capacitors. Instead, intrinsic capacitances 415-*a* and 415-*b* may represent capacitance that results from physical characteristics, including the dimensions, of digit line 115-*b* and reference line 225-*a*. In some cases, reference line 225-*a* is an unused or inactive digit line. In some examples, digit line 115-*b* and reference line 225-*a* may be connected to or separated from virtual ground through equalization switches 420-*a* and 420-*b*. A virtual ground may act as a common reference for circuit 400-*a* and may also be referred to as ground or 0V, although, the virtual ground may float to a voltage that is different than (e.g., greater or less than) zero volts when compared with an earth ground.

In some examples, control signals (e.g., a linear equalization signal) may be used to activate or deactivate equalization switches 420-*a* or 420-*b* by increasing or decreasing a linear equalization voltage applied to the switching component, respectively. In some cases, equalization switch 420-*a* may be used to prevent the voltage of digit line 115-*b* from floating while digit line 115-*b* is not being used. Equalization switches 420-*a* and 420-*b* and isolation components 425-*a* and 425-*b* may be implemented as transistors (e.g., field effect transistors (FETs)).

As depicted, first ferroelectric memory cell 105-*b* is in electronic communication with digit line 115-*b*. First ferroelectric memory cell 105-*b* may include a selection component in electronic communication with a ferroelectric capacitor via word line 110-*b*, as described with reference to FIG. 2. The selection component may be activated by applying a voltage to word line 110-*b* and may be used to provide a conductive path between the ferroelectric capacitor and the digit line 115-*b*. In one example, first ferroelectric memory cell 105-*b* may be selected, using the selection component, for a read operation to determine a state stored by the ferroelectric capacitor. In some examples, a memory array simultaneously accesses a set of memory cells, or a "page" that includes first ferroelectric memory cell 105-*b*. A page may be associated with an address and may be accessed using the associated address.

A voltage may be applied to reference line 225-*a* to provide a reference for comparing with the voltage of digit line 115-*b*. The voltage of reference line 225-*a* may be used by sense component 125-*b* as a reference for comparison against the voltage of digit line 115-*b*. In some cases, reference line 225-*a* is in electronic communication with a memory cell, such as a second ferroelectric memory cell 105-*c*, that provides a reference voltage when accessed (e.g., during a sensing operation).

Plate line 210-*a* may also be in electronic communication with the ferroelectric capacitor. In some cases, a plate of the ferroelectric capacitor may be biased via plate line 210-*a* (e.g., for a read operation). Applying a non-zero voltage across the capacitor in combination with applying a voltage to word line 110-*b* may result in the ferroelectric capacitor charging digit line 115-*b*. That is, upon accessing first ferroelectric memory cell 105-*b*, the ferroelectric capacitor may share charge with digit line 115-*b* via intrinsic capacitance 415-*a*. In some examples, the digit line 115-*b* may be driven to a ground reference or a supply voltage, and a voltage may be applied at plate line 210-*a* to apply a voltage across the ferroelectric capacitor. For example, the voltage applied to plate line 210-*a* may be ramped from a first to a second voltage. In some examples, a constant voltage may be applied to plate line 210-*a* and the voltage of digit line 115-*b* may be driven to a virtual ground or a supply voltage to apply a voltage across the ferroelectric capacitor.

Isolation components 425-*a* and 425-*b* may be used to isolate digit line 115-*b* and reference line 225-*a* from sense component 125-*b*. The portion of sense component 125-*b* including control lines that may be isolated from circuit 400-*a* may be referred to as the interior or gut of the sense component 125-*b*. Isolation component 425-*a*, which may be a first set of transistors, may be a first set of isolation components and may include isolation components 425-*a*-1 and 425-*a*-2. The first set of transistors may thus have a first configuration with respect to the sense component. The first set of isolation components may be referred to as true isolation components 425-*a* or true transistors and may be configured about sense component 125-*b* to provide a conductive path between the first input line 240-*c* and the digit line 115-*b* via a first true isolation component 425-*a*-1 (or a first transistor of the first set of transistors), and a conductive path between the second input line 240-*d* and the reference line 225-*a* via second true isolation component 425-*a*-2 (or a second transistor of the first set of transistors). True isolation components 425-*a* may be activated using a first set of control lines (e.g., via a controller).

Isolation components 425-*b*, which may be a second set of transistors, may be a second set of isolation components and may include isolation components 425-*b*-1 and 425-*b*-2. The second set of isolation components may be referred to as inverting isolation components 425-*b* or inverting transistors and may be configured about sense component 125-*b* to provide a conductive path between second input line 240-*d* and digit line 115-*a* via first inverting isolation component 425-*b*-1 (first transistor of the second set of transistors), and a conductive path between the first input line 240-*c* and the reference line 225-*a* via second inverting isolation component 425-*b*-2 (second transistor of the second set of transistors). The second set of transistors may thus have a second configuration with respect to the sense component. Inverting isolation components 425-*b* may be activated using a second set of control lines (e.g., via a controller). In some cases, the first and second set of control lines are in electronic communication with a common control node that provides a first voltage to the first set of control lines and the opposite voltage to the second set of control nodes, and vice versa. In this way, the true isolation components 425-*a* may be activated while the inverting isolation components 425-*b* are deactivated, and vice versa.

Sense component 125-*b* may be used to determine the stored state of first ferroelectric memory cell 105-*b*. In some cases, sense component 125-*b* is or includes a sense amplifier. Sense component 125-*b* may be operated by voltage source 405 and voltage source 410. In some examples, voltage source 405 is a positive supply voltage, while voltage source 410 is a negative supply voltage or a virtual ground. Sense component 125-*b* may be used to determine a logic value of the first ferroelectric memory cell 105-*b* based on the voltage of digit line 115-*b* and the voltage of the reference line 225-*a*. In some examples, sense component 125-*b* is activated or "fired"—e.g., by a controller—to trigger a comparison between the voltage of digit line 115-*b* and the voltage of reference line 225-*a*.

Sense component 125-*b* may latch the output of a sense amplifier to the voltage provided by either voltage source 405 or voltage source 410. In some cases, the output voltage is determined according to the polarity of sense component 125-*b* (e.g., output voltage is equal to the difference between first input line 240-*c* and second input line 240-*d*). For instance, if the voltage of the digit line 115-*b* is greater than the voltage of the reference line 225-*a*, then sense component 125-*b* may latch the output of the sense amplifier at a positive voltage supplied from voltage source 405. Sense component 125-*b* may also be used to write a logic value to first ferroelectric memory cell 105-*b*. For instance, during a write operation, sense component 125-*b* may be triggered to apply a voltage that is greater than a voltage applied at plate line 210-*a* to write a logic state 1 to first ferroelectric memory cell 105-*b*. In some examples, the voltage applied by sense component 125-*b* is dependent on voltage source 405 and 410. For instance, voltage source 405 may provide the voltage that is greater than the voltage applied at plate line 210-*a*.

In some examples, a controller may be used to operate circuit 400-*a* to maintain the performance of first ferroelectric memory cell 105-*b*. For instance, the controller may be used to trigger sense component 125-*b* to perform a sensing operation or to apply a voltage to digit line 115-*b* and/or reference line 225-*a*. The controller may also be used to activate or deactivate equalization switches 420 and isolation components 425 (e.g., via a first set of control lines and a second control lines) and to select first ferroelectric memory cell 105-*b* via word line 110-*b*. In some examples, the controller may be used to access first ferroelectric memory cell 105-*b* using word line 110-*b* and to read/write to first ferroelectric memory cell 105-*b* using plate line 210-*a* and digit line 115-*b*. The controller may include one or more components (e.g., a timing component) to aid in determining that the first ferroelectric memory cell 105-*b* or that a ferroelectric memory cell within a subsection of a memory array has stored a logic state for a time period. After identifying the time period has elapsed, the controller may use the word line 110-*b*, plate line 210-*a*, digit line 115-*b*, sense component 125-*b*, and isolation components 425 to write the opposite logic state to first ferroelectric memory cell 105-*b*.

For instance, the controller may activate true isolation components 425-*a*, deactivate inverting isolation components 425-*b*, and may trigger sense component 125-*b* to sense the logic state stored by memory via true isolation components 425-*a*. Sense component 125-*b* may then output a voltage corresponding to the logic state stored by first ferroelectric memory cell 105-*b*. Subsequently, the controller may deactivate true isolation components 425-*a*, activate inverting isolation components 425-*b*, and use the output voltage to write the sensed logic state back to first ferroelectric memory cell 105-*b*. However, by using the inverting isolation components 425-*b*, the opposite logic state may be written back to first ferroelectric memory cell 105-*b*, as will be discussed in more detail below.

The controller may also keep track of which memory cells are storing inverted logic values. For instance, the controller may increment a counter 430 each time a page is updated to store inverted logic states. In some cases, the counter 430 may be updated to store the address of the last page to be updated with inverted logic states. In some examples, a value of the counter 430 may be stored in non-volatile memory (e.g., a non-volatile latch), which may be implemented as a third ferroelectric memory cell. In subsequent access operations (e.g., read/write) of another page, the controller may compare a value of the counter 430 with an address of a page that is to be accessed (e.g., via a comparator that receives a first value of the counter 430 at a first input and the address of the page at a second input). If the address being accessed is less than the address associated with the counter 430, the controller may determine that the memory cells being accessed are storing or are expected to be storing inverted logic state. Accordingly, the controller may activate the inverting isolation components 425-b to read data from or write data to the memory cells. If the address being accessed is greater than the address associated with the counter 430, the controller may activate the true isolation component 425-b to read the state currently stored by the memory cells or to write an intended logic state to the memory cells.

Although the configuration of circuit 400-a is generally discussed in the context of ferroelectric memory cell technology, this configuration may similarly be used for operating other types of memory cells (e.g., DRAM, memory-RAM (MRAM), etc.). For instance, the true isolation components 425-a and the inverting isolation components 425-b may similarly be used to read and/or store intended or inverted logic states to or from the other types of memory cells.

Figure 4B:
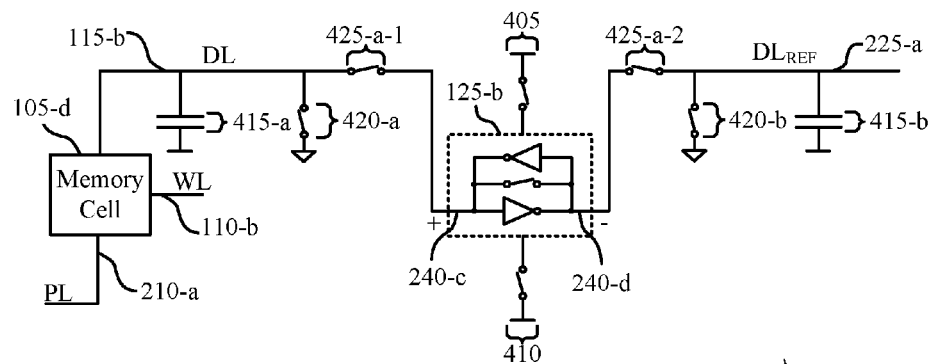

FIG. 4B illustrates an example operation of circuit 400-b where true isolation components 425-a are activated and inverting isolation components 425-b are deactivated in accordance with various embodiments of the present disclosure. For ease of reference, the deactivated inverted isolation components 425-b and second ferroelectric memory cell 105-c are not drawn in circuit 400-b. As shown in FIG. 4B, activating true isolation components 425-a-1 and 425-a-2 provides a conductive path between first input line 240-c and digit line 115-b and another conductive path between second input line 240-d and reference line 225-a. This configuration may result in sense component 125-b outputting a voltage that corresponds to the logic state that is currently stored by memory cell 105-d (i.e., the true logic state). For example, if memory cell 105-d stores a logic value 1, sense component 125-b will output a voltage corresponding to the logic value 1. This configuration may be used to access a memory cell that does not store an inverted logic state.

Figure 4C:
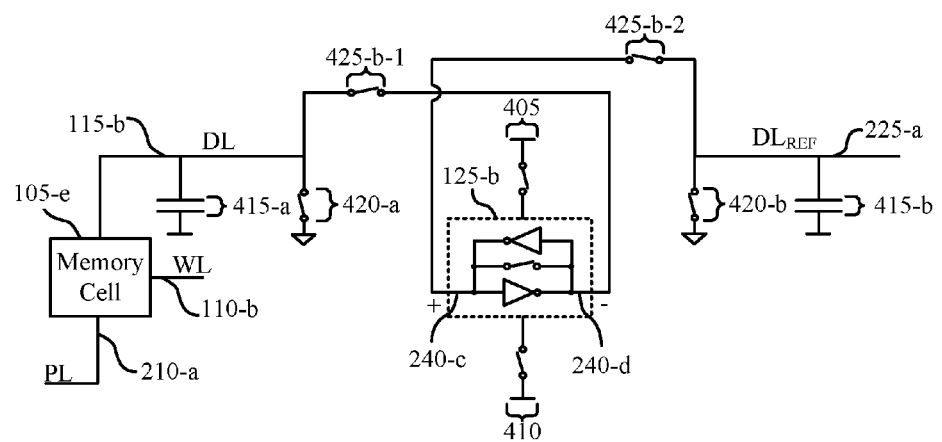

FIG. 4C illustrates an example operation of circuit 400-c where true isolation components 425-a are deactivated and inverting isolation components 425-b are activated in accordance with various embodiments of the present disclosure. For ease of reference, the deactivated true isolation components 425-a and second ferroelectric memory cell 105-c are not drawn in circuit 400-c. As shown in FIG. 4C, activating inverting isolation components 425-b-1 and 425-b-2 provides a conductive path between first input line 240-c and reference line 225-a and another conductive path between second input line 240-d and digit line 115-b. This configuration may result in sense component 125-b outputting a voltage that corresponds to a logic state that is opposite the logic state that is currently stored by memory cell 105-e (i.e., the inverted logic state). For example, if memory cell 105-e stores a logic value 1, sense component 125-b will output a voltage corresponding to the logic value 0.

This configuration may be used to access a memory cell that is storing or is expected to be storing an inverted logic state. For instance, the controller may determine that an address used to access memory cell 105-e is selected for a write operation. The controller may also determine the address to be accessed is less than the address associated with the counter, and may determine that an inversion operation has been performed for the page and that memory cell 105-e is storing an inverted logic state. Accordingly, to ensure the proper logic state is read during a subsequent read operation, the controller may write inverted logic states to the memory cells of the page. For instance, the controller may write the logic state to memory cell via inverting isolation components 425-b.

Figure 5A:
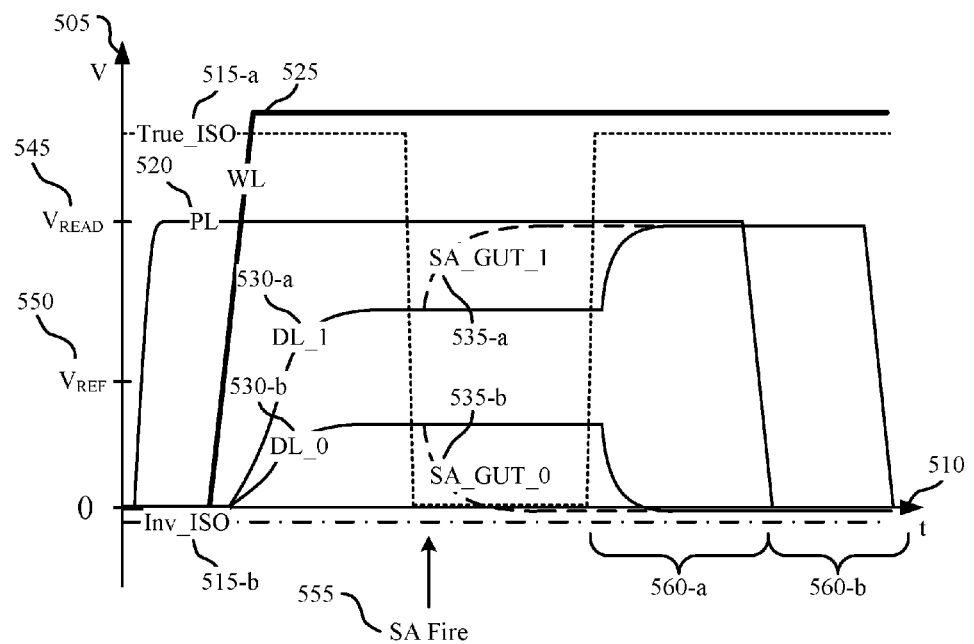
FIGS. 5A-5C show example diagrams illustrating aspects of operation of the example circuit in accordance with various embodiments of the present disclosure.

FIG. 5A shows an example timing diagram 500-a illustrating aspects of operation of the example circuit in accordance with various embodiments of the present disclosure. Timing diagram 500-a depicts voltage on axis 505 and time on axis 510. Thus, voltages resulting from reading or writing to a memory cell, such as first ferroelectric memory cell 105-b, may be represented as a function of time. For example, timing diagram 500-a includes true isolation voltage 515-a, inverting isolation voltage 515-b, word line voltage 525, plate line voltage 520, digit line voltages 530-a and 530-b, and internal or gut voltages 535-a and 535-b. Timing diagram 500-a may also include read voltage 545, reference voltage 550, and firing time 555.

In some examples, timing diagram 500-a illustrates an example read and write-back operation using true isolation components 425-a. Voltages that approach zero may be offset from axis 510 for ease of representation; in some cases, these voltages may be equal to or approximately equal to zero. Furthermore, in some cases, the timing of certain signals may be moved forward or backwards in time or may overlap with one another. Timing diagram 500-a depicts an example operation of circuit 400 described with reference to FIGS. 4A-4C. FIG. 5A is described below with reference to components of preceding figures. FIG. 5A may illustrate aspects of a read and write-back operation performed on a memory cell using true isolation components 425-a, which may correspond to the configuration provided in circuit 400-b. The operation discussed in FIG. 5C may be used to read and write to memory cells storing true logic states.

As discussed with reference to FIGS. 4A-4C, a read operation may begin with a true isolation voltage 515-a being applied to true isolation components 425-a, while an inverting isolation voltage 515-b is applied to inverting isolation components 425-b. The true isolation voltage 515-a may be a voltage used for activating true isolation components 425-a, while the inverting isolation voltage 515-b may be a voltage used for deactivating inverting isolation components 425-b (e.g., virtual ground). Concurrently, plate line voltage 520 may be applied to plate line 210-a. Subsequently, word line voltage 525 may be applied to word line 110-b, selecting first ferroelectric memory cell 105-b. Selecting word line 110-b may trigger a ferroelectric capacitor of first ferroelectric memory cell 105-b to share charge with intrinsic capacitance 415-a, at which point digit line voltage 530 may increase.

The increase in digit line voltage 530 may be dependent upon the logic state that is initially stored by first ferroelectric memory cell 105-b. For instance, if first ferroelectric memory cell 105-b originally stores a logic state 1, digit line voltage 530-a may result on digit line 115-b. On the contrary, if first ferroelectric memory cell 105-b originally stores a logic state 0, digit line voltage 530-b may result on digit line 115-b. True isolation voltage 515-a may then be removed, isolating sense component 125-*b* from circuit 400, and shortly thereafter, sense component 125-*b* may be triggered to compare the resulting digit line voltage with the reference voltage 550 at firing time 555. Since digit line 115-*b* may be isolated from the internal portion or gut of sense component 125-*b*, the resulting digit line voltages 530 may be maintained throughout the comparison. Reference voltage 550 may be applied to reference line 225-*a*, which may be in electronic communication with second input line 240-*d*.

Dependent on the result of the comparison the gut voltage 535 may be driven to either the voltage of high voltage source 405 or the voltage of low voltage source 410. For instance, if digit line voltage 530-*a* is present on digit line 115-*b*, the gut voltage 535-*a* may be driven to the voltage of high voltage source 405. The gut voltages 535-*a* and 535-*b* may be measured at first input line 240-*c*. Concurrently, the voltage of second input line 240-*d* may be driven to low voltage source 410. Otherwise, if digit line voltage 530-*b* is present on digit line 115-*b*, the gut voltage 535-*b* may be driven to low voltage source 410, and the voltage of second input line 240-*d* may be driven to high voltage source 405. The output voltage of sense component 125-*b* (e.g., output voltage=the voltage of first input line 240-*c*—the voltage of second input line 240-*d*) may be stored in a latch and read by a memory controller to determine the corresponding logic state stored by first ferroelectric memory cell 105-*b*. For instance, the memory controller may determine that first ferroelectric memory cell 105-*b* originally stored a logic state 1 if gut voltage 535-*a* is positive after a read operation is performed.

After storing the output voltage of sense component 125-*b*, true isolation voltage 515-*a* may be reapplied to true isolation components 425-*a* electronically returning sense component 125-*b* back into circuit 400 and providing a conductive path between digit line 115-*b* and first input line 240-*c*. Reconnecting the digit line 115-*b* to first input line 240-*c* may result in the digit line voltage 530 may being driven to the resulting gut voltage 535. For instance, if first ferroelectric memory cell 105-*b* originally stores a logic state 1, the corresponding digit line voltage 530-*a* may rise to the gut voltage 535-*a*. Or if first ferroelectric memory cell 105-*b* originally stores a logic state 0, the corresponding digit line voltage 530-*b* may decrease to the gut voltage 535-*b*.

A write-back operation may then be performed to return the read logic state back to first ferroelectric memory cell 105-*b*. A write-back operation may include two portions 560. The logic state that is written back may be dependent on the voltage of the digit line 115-*b*. For instance, when writing back the logic state 0, digit line voltage 530-*b* may be at or near a virtual ground and plate line voltage 520 may be at or near read voltage 545, resulting in a positive voltage being applied across first ferroelectric memory cell 105-*b*. During second portion 560-*b*, plate line voltage 520 may be decreased, the voltage across first ferroelectric memory cell 105-*b* may be removed, and the resulting charge state (e.g., charge state 305) of memory cell may be associated with a logic 0. When writing back the logic state 1, digit line voltage 530-*b* and plate line voltage 520 may be at or near read voltage 545, resulting in no voltage being applied across first ferroelectric memory cell 105-*b*. During second portion 560-*b*, plate line voltage 520 may be decreased and the voltage across first ferroelectric memory cell 105-*b* may be driven negative. At the end of the write-back operation, the digit line 115-*b* may be driven to a virtual ground and the resulting charge state (e.g., charge state 310) of memory cell may be associated with a logic 1.

As illustrated in FIG. 5A, a read operation using true isolation components 425-*a* may result in sense component 125-*b* outputting a voltage corresponding to the logic state that is currently stored by first ferroelectric memory cell 105-*b*. And a write-back operation using true isolation components 425-*a* may result in the same logic state that is read being written back to first ferroelectric memory cell 105-*b*. In some cases, a memory controller may select true isolation components 425-*a* based on a comparison of an address used for accessing a group of memory cells including memory cell first ferroelectric memory cell 105-*b* with an address associated with a counter that keeps track of which memory cells or pages are storing inverted logic states.

Figure 5B:
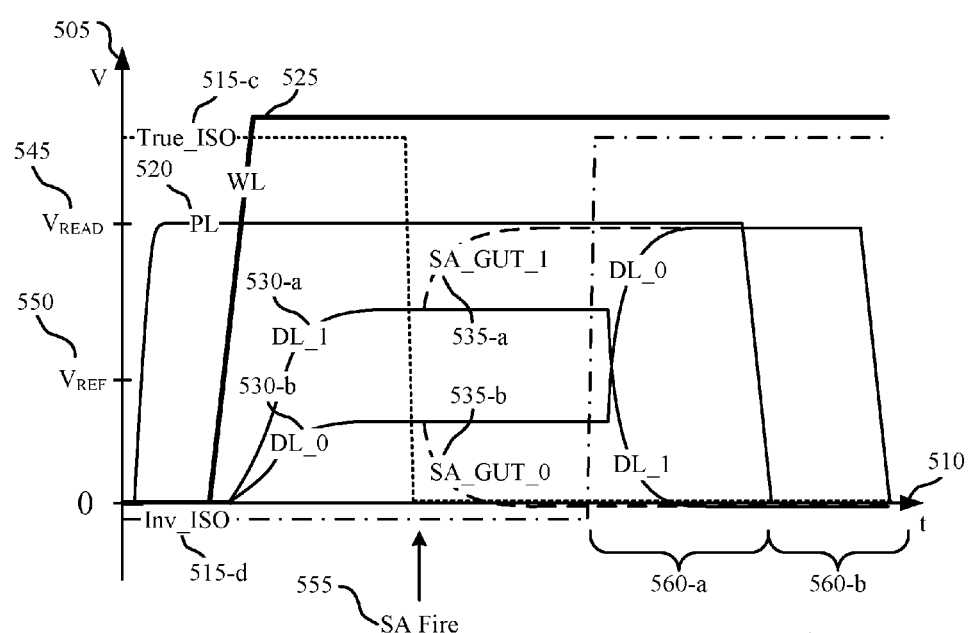

FIG. 5B shows an example timing diagram 500-*b* illustrating aspects of an operation of the example circuit in accordance with various embodiments of the present disclosure. Timing diagram 500-*b* depicts voltage on axis 505 and time on axis 510. Thus, the sensing voltage resulting from reading a memory cell, such as first ferroelectric memory cell 105-*b* may be represented as a function of time. Timing diagram 500-*b* depicts an example operation of circuit 400 described with reference to FIGS. 4A-4C. FIG. 5B is described below with reference to components of preceding figures. FIG. 5B may illustrate aspects of a data inversion operation for a memory cell, during which a read operation is performed using true isolation components 425-*a* and a write-back operation is performed using inverting isolation components 425-*b*. The read operation may correspond to the configuration provided in circuit 400-*b*, while the write-back operation may correspond to the configuration provided in circuit 400-*c*. The operation discussed in FIG. 5C may be used to invert and un-invert (i.e., return to true) logic states stored by memory cells.

As discussed with reference to FIGS. 4A-4C and 5A, first ferroelectric memory cell 105-*b* may be read using true isolation components 425-*a*. Similar to the read operation performed in FIG. 5A, the gut voltage 535-*a* may result if first ferroelectric memory cell 105-*b* originally stores a logic 1, while gut voltage 535-*b* may result if first ferroelectric memory cell 105-*b* originally stores a logic 0. Accordingly, the memory controller may read the true logic state of first ferroelectric memory cell 105-*b* based on the output voltage of sense component 125-*b*. Although in some cases, the memory controller may refrain from reading a logic state during an inversion operation. However, after storing the output the write back operation may be performed using inverting isolation components 425-*b*. That is, true isolation voltage 515-*c* may be maintained at or near virtual ground, while inverting isolation voltage 515-*d* may be increased to activate inverting isolation components 425-*b*. As a result, the voltage of second input line 240-*d* may be applied to digit line 115-*b* for the write-back operation.

As discussed above the voltage of second input line 240-*d* moves opposite the gut voltage 535. Accordingly, after electrically returning sense component 125-*b* to circuit 400, the digit line voltage 530 may not follow the corresponding gut voltage 535, but may follow the complementary gut voltage. Therefore, the digit line voltage 530 used to write the sensed logic state back to first ferroelectric memory cell 105-*b* may be associated with the opposite logic state and the first ferroelectric memory cell 105-*b* may store an inverted logic state. For example, first ferroelectric memory cell 105-*b* may originally store a logic 1 and digit line voltage 530-*a* may result when first ferroelectric memory cell 105-*b* is accessed (e.g., by asserting word line voltage 525). True isolation components 425-*a* may be used to read first ferroelectric memory cell 105-*b* and the gut voltage 535-*a* may be driven to voltage of high voltage source 405, while the voltage of second input line 240-*d* may be driven to the voltage of low voltage source 410. Therefore, the output voltage of the sense component may correspond to a logic 1 and may be stored in a latch.

When sense component 125-*b* is electronically returned to the circuit 400 via inverting isolation components 425-*b*, digit line 115-*b* may be electronically connected to second input line 240-*d*. Accordingly, digit line voltage 530-*a* may be driven to the opposite voltage of gut voltage 535-*a* (e.g., virtual ground). Then during the first portion 560-*a* of write-back, a positive voltage may be applied across first ferroelectric memory cell 105-*b*, and subsequently removed, during second portion 560-*b*. Thus, the resulting charge state of first ferroelectric memory cell 105-*b* (e.g., charge state 305) may correspond to a logic 0.

As illustrated in FIG. 5B, an inversion operation may include a read operation using true isolation components 425-*a* and a write-back operation using inverting isolation components 425-*b*. The read operation using true isolation components 425-*a* may result in sense component 125-*b* outputting a voltage corresponding to the logic state that is currently stored by first ferroelectric memory cell 105-*b*. And the write-back operation using inverting isolation components 425-*b* may result in the opposite logic state being written back to first ferroelectric memory cell 105-*b*. In some cases, a memory controller may sequentially perform inversion operations one each memory cell or group of memory cells in a memory array. For instance, memory controller select a first address corresponding to a first page and may simultaneously perform an inversion operation for each memory cell included in the first page. Memory controller may then select a second address corresponding to the second page and perform an inversion operation for the second page, and so on. After an inversion operation is performed, the memory cells of the page may store inverted logic states, or the opposite logic state of an intended logic state. After reaching the final page, the memory controller may work backwards through the addresses performing inversion operations so that the memory cells again store their intended logic states.

A counter may be used to keep track of which memory cells or pages have been inverted. For instance, a value of the counter may be incremented with each inversion operation. In some cases, each address may be mapped to a value of the counter to enable direct comparisons between the value of the counter and an address of a page to be accessed. In another example, the address of the latest page to be inverted may be stored at the counter. The memory controller may compare the address stored at the counter with an address of a page to be accessed and determine whether the data stored at the page is true or inverted.

Figure 5C:
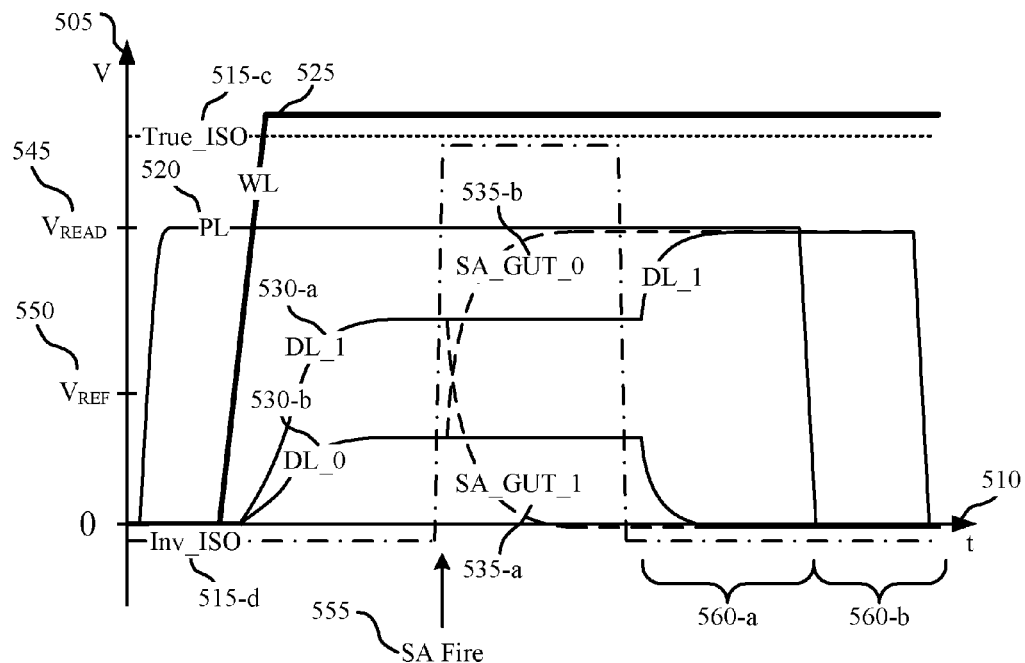

FIG. 5C shows an example timing diagram 500-*c* illustrating aspects of an operation of the example circuit in accordance with various embodiments of the present disclosure. Timing diagram 500-*c* depicts voltage on axis 505 and time on axis 510. Thus, the sensing voltage resulting from reading a memory cell, such as first ferroelectric memory cell 105-*b* may be represented as a function of time. Timing diagram 500-*c* depicts an example operation of circuit 400 described with reference to FIGS. 4A-4C. FIG. 5C is described below with reference to components of preceding figures. FIG. 5C may illustrate aspects of a read and write-back operation performed on a memory cell using inverting isolation components 425-*b*, which may correspond to the configuration provided in circuit 400-*c*. The operation discussed in FIG. 5C may be used to read and write to memory cells storing inverted logic states.

As discussed with reference to FIGS. 4A-4C, a read operation may begin with an inverting isolation voltage 515-*d* being applied to inverting isolation components 425-*b*, while a true isolation voltage 515-*c* is applied to true isolation components 425-*a*. The inverting isolation voltage 515-*d* may be a voltage used for activating inverting isolation components 425-*b*, while the true isolation voltage 515-*c* may be a voltage used for deactivating true isolation components 425-*a* (e.g., virtual ground). Concurrently, plate line voltage 520 may be applied to plate line 210-*a*. Subsequently, word line voltage 525 may be applied to word line 110-*b*, selecting first ferroelectric memory cell 105-*b*. Selecting word line 110-*b* may trigger a ferroelectric capacitor of first ferroelectric memory cell 105-*b* to share charge with an intrinsic capacitance 415-*a*, at which point digit line voltage 530 may increase, as described above with reference to FIG. 5A. However, digit line 115-*b* may be electronically connected to second input line 240-*d* instead of first input line 240-*c*.

True isolation voltage 515-*a* may then be removed, isolating sense component 125-*b* from circuit 400-*a*, and shortly thereafter, sense component 125-*b* may be triggered to compare the resulting digit line voltage with the reference voltage 550 at firing time 555. Dependent on the result of the comparison the gut voltage 535 may be driven to either the voltage of high voltage source 405 or the voltage of low voltage source 410. For instance, if digit line voltage 530-*a* is present on digit line 115-*b* and, therefore, second input line 240-*d*, then the gut voltage 535-*a* may be driven to the voltage of low voltage source 410. The gut voltages 535-*a* and 535-*b* being measured at first input line 240-*c*. Concurrently, the voltage of second input line 240-*c* may be driven to high voltage source 405.

Otherwise, if digit line voltage 530-*b* is present on digit line 115-*b*, the gut voltage 535-*b* may be driven to high voltage source 405, and the voltage of second input line 240-*d* may be driven to low voltage source 410. Since digit line 115-*b* may be isolated from the gut of sense component 125-*b*, the resulting digit line voltages 530 may be maintained throughout the comparison. The output voltage of sense component 125-*b* (e.g., output voltage=the voltage of first input line 240-*c*—the voltage of second input line 240-*d*) may be stored in a latch and read by a memory controller to determine the corresponding logic state stored by first ferroelectric memory cell 105-*b*. Accordingly, the output voltage of sense component 125-*b* may correspond to a logic state opposite the logic state stored by memory cell 105-*b*. For instance, the memory controller may determine that first ferroelectric memory cell 105-*b* originally stored a logic state 0 if gut voltage 535-*a* is a low voltage (e.g., virtual ground), despite memory cell originally storing a logic state 1.

After storing the output voltage of sense component 125-*b*, inverting isolation voltage 515-*d* may be reapplied to inverting isolation components 425-*b* electronically returning sense component 125-*b* back into circuit 400 and providing a conductive path between digit line 115-*b* and second input line 240-*d*. Reconnecting the digit line 115-*b* to second input line 240-*d* may result in the digit line voltage 530 being driven to a voltage opposite the resulting gut voltage 535-*a* at first input line 240-*c*. For instance, if first ferroelectric memory cell 105-*b* originally stores a logic state 1, the corresponding digit line voltage 530-*a* may rise to a complementary voltage to gut voltage 535-a (since gut voltage 535-a is measured at first input line 240-c and digit line 115-b is connected to second input line 240-d.). Or if first ferroelectric memory cell 105-b originally stores a logic state 0, the corresponding digit line voltage 530-b may decrease to the complementary voltage to gut voltage 535-b.

Therefore, the digit line voltage 530 used to write the sensed logic state back to first ferroelectric memory cell 105-b may be associated with the opposite logic state and the first ferroelectric memory cell 105-b may store an inverted logic state. For example, first ferroelectric memory cell 105-b may originally store a logic 1 and digit line voltage 530-a may result when first ferroelectric memory cell 105-b is accessed (e.g., by asserting word line voltage 525). Inverting isolation components 425-a may be used to read first ferroelectric memory cell 105-b and the gut voltage 535-a may be driven to the voltage of low voltage source 410 while the voltage of second input line 240-d may be driven to the voltage of high voltage source 405. Therefore, the output voltage of the sense component may correspond to a logic 0 and may be stored in a latch.

When sense component 125-b is electronically returned to the circuit 400 via inverting isolation components 425-b, digit line 115-b may be electronically connected to second input line 240-d. Accordingly, digit line voltage 530-a may be driven to the opposite voltage of gut voltage 535-a (e.g., read voltage 545). Then during the first portion 560-a of write-back, plate line voltage 520 may also be at read voltage 545 and no voltage may be applied across first ferroelectric memory cell 105-b. During the second portion 560-b, plate line voltage 520 may be removed and a negative voltage may be applied across first ferroelectric memory cell 105-b. At the end of the write-back operation, the digit line 115-b may be driven to a virtual ground and the resulting charge state (e.g., charge state 310) of memory cell may be associated with a logic 1.

Figure 6:
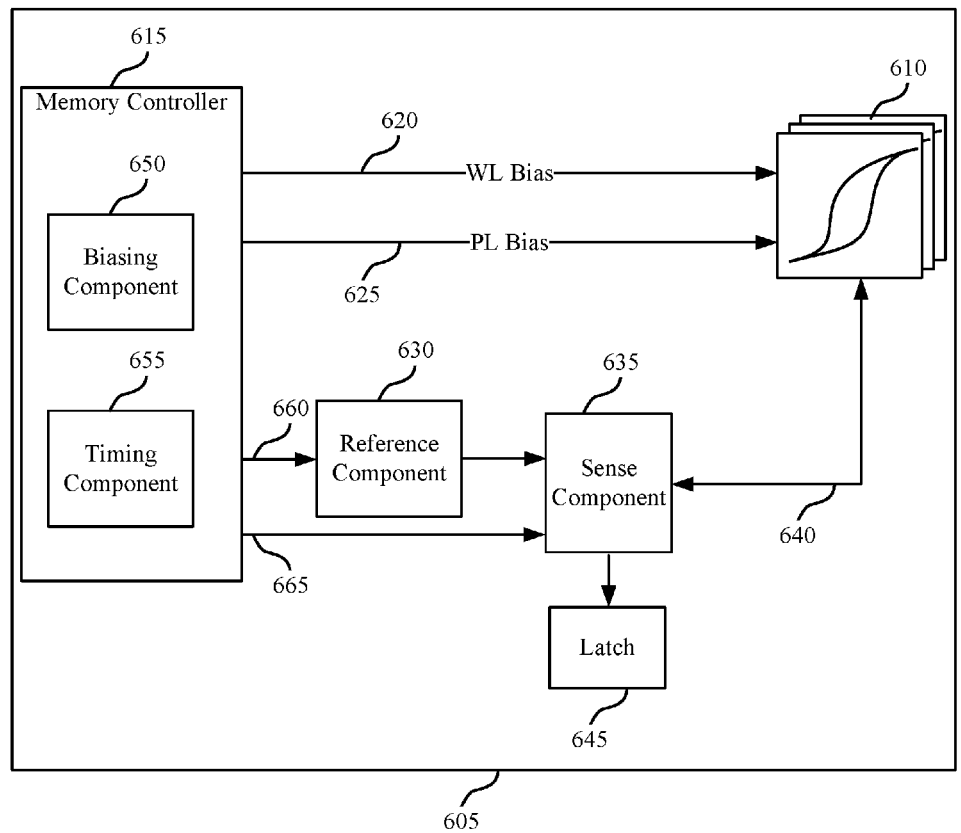
FIG. 6 illustrates a block diagram of an example ferroelectric memory array that supports the inversion of data bits in accordance with various embodiments of the present disclosure.

FIG. 6 shows a block diagram 600 of a memory array 605 that supports recovery of a ferroelectric memory cell using fast cycling in accordance with various embodiments of the present disclosure. Memory array 605 may be referred to as an electronic memory apparatus and includes memory controller 615 and one or more memory cells 710, which may be examples of memory controller 140 and a memory cell 105 as described with reference to FIGS. 1, 2, and 4. In some cases, a memory cell 710 may be associated with multiple memory cells 105 as described with reference to FIG. 1. Memory controller 615 may include biasing component 650 and timing component 655 and may operate memory array 605 as described in FIG. 1.

Memory controller 615 may be in electronic communication with word line 620, digit line 640, sense component 635, and plate line 625, which may be examples of word line 110, digit line 115, sense component 125, and plate line 210 described with reference to FIGS. 1, 2, and 4. Memory array 605 may also include reference component 630 and latch 645. The components of memory array 605 may be in electronic communication with each other and may perform aspects of the functions described with reference to FIGS. 1-5. In some cases, reference component 630, sense component 635, and latch 645 may be components of memory controller 615.

In some examples, digit line 640 is in electronic communication with sense component 635 and a ferroelectric capacitor of ferroelectric memory cells 610. A ferroelectric memory cell 610 may be writable with a logic state (e.g., a first or second logic state). Word line 620 may be in electronic communication with memory controller 615 and a selection component of ferroelectric memory cell 610. Plate line 625 may be in electronic communication with memory controller 615 and a plate of the ferroelectric capacitor of ferroelectric memory cell 610. Sense component 635 may be in electronic communication with memory controller 615, reference line 660, digit line 640, and latch 645. Reference component 630 may be in electronic communication with memory controller 615 and reference line 660. Sense control line 665 may be in electronic communication with sense component 635 and memory controller 615. These components may also be in electronic communication with other components, both inside and outside of memory array 605, in addition to components not listed above, via other components, connections, or busses.

Memory controller 615 may be configured to activate word line 620, plate line 625, or digit line 640 by applying voltages to those various nodes. For example, biasing component 650 may be configured to apply a voltage to operate memory cell 610 to read or write memory cell 610 as described above. In some cases, memory controller 615 may include a row decoder, column decoder, or both, as described with reference to FIG. 1. This may enable memory controller 615 to access one or more memory cells 105. Biasing component 650 may also provide voltage potentials to reference component 630 in order to generate a reference signal for sense component 635. Additionally, biasing component 650 may provide voltage potentials for the operation of sense component 635.

In some cases, memory controller 615 may perform its operations using timing component 655. For example, timing component 655 may control the timing of the various word line selections or plate biasing, including timing for switching and voltage application to perform the memory functions, such as reading and writing, discussed herein. In some cases, timing component 655 may control the operations of biasing component 650.

Reference component 630 may include various components to generate a reference signal for sense component 635. Reference component 630 may include circuitry configured to produce a reference signal. In some cases, reference component 630 may be implemented using other ferroelectric memory cells 105. Sense component 635 may compare a signal from memory cell 610 (through digit line 640) with a reference signal from reference component 630. Upon determining the logic state, the sense component may then store the output in latch 645, where it may be used in accordance with the operations of an electronic device that memory array 605 is a part. Sense component 635 may include a sense amplifier in electronic communication with the latch and the ferroelectric memory cell.

In some cases memory controller may be used to perform aspects of inverting logic states stored by memory cells 710. For example, memory controller 615 may read a first logic state stored by a memory cell through a first set of transistors that is in electronic communication with a sense component and the memory cell, and write a second logic state different from the first logic state to the memory cell through a second set of transistors that is in electronic communication with the sense component and the memory cell, where the second set of transistors is different from the first set of transistors. Memory controller 615 may additionally compare a first value of a counter with a second value associated with a first address corresponding to a set of memory cells, the first value of the counter being associated with a second address, and read a set of logic states corresponding to the set of memory cells using a first set of transistors or a second set of transistors based on the comparing, where the first set of transistors and the second set of transistors are in electronic communication with a sense component and the set of memory cells.

Figure 7:
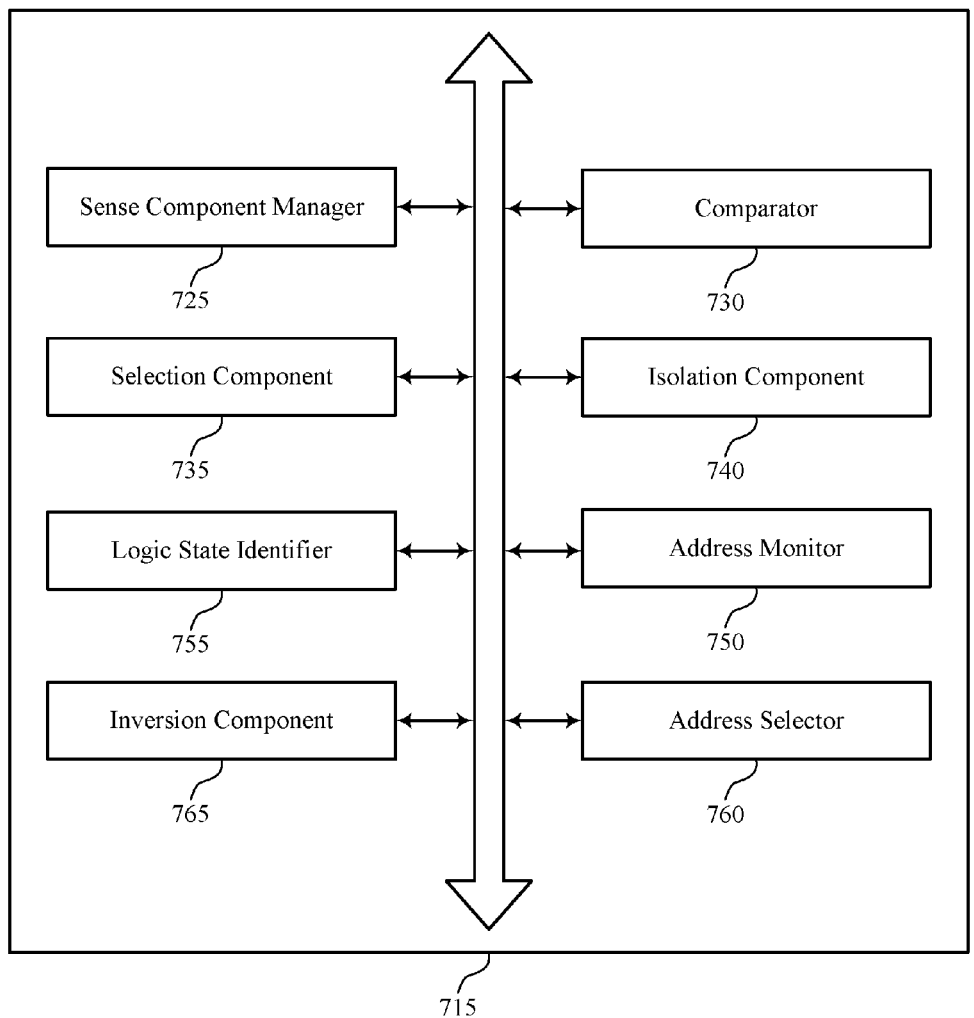
FIG. 7 illustrates a block diagram of a controller that supports the inversion of data bits in accordance with aspects of the present disclosure.

FIG. 7 shows a block diagram 700 of a memory controller 715 that supports the inversion of data bits in accordance with various aspects of the present disclosure. The memory controller 715 may be an example of aspects of a memory controller 615 described with reference to FIG. 6. The memory controller 715 may include sense component manager 725, comparator 730, selection component 735, isolation component 740, address monitor 750, logic state identifier 755, address selector 760, inversion component 765. The memory controller 715 may also include biasing component 650 and timing component 655 as described with reference to FIG. 6. Each of these modules may communicate, directly or indirectly, with one another (e.g., via one or more buses).

In a first example, sense component manager 725 may trigger a sense component to read a first logic state (e.g., a true logic state) stored by a memory cell through a first set of transistors that is in electronic communication with a sense component and the memory cell. Reading the first logic state may include using selection component 735 to select the memory cell to cause the discharging of the memory cell via a digit line that is in electronic communication with the first set of transistors and the sense component. Isolation component 740 may be used to isolate the sense component from the memory cell after the discharging and sense component manager 725 may subsequently activate the sense component to compare a voltage of the digit line with a reference voltage. Isolating the sense components may include using isolation component 740 to cause the first set of transistors to be deactivated.

In some examples, the sense component manager 725 may cause the sense component to write a second logic state (e.g., an inverted logic state), different from the first logic state, to the memory cell through a second set of transistors that is in electronic communication with the sense component and the memory cell. In some cases, the second set of transistors may be different from the first set of transistors. Writing the second logic state may include using isolation component 740 to activate the second set of transistors after the comparison at the sense component. Accordingly, the resultant voltage of the sense component, that occurs as a result of comparing the voltage of the digit line with the reference voltage, may be applied to the digit line. In some cases, reading a first logic state and writing a second logic state to a memory cell occurs periodically. A timing component, such as timing component 655, may be used to determine when to write the second logic state. In some cases, a periodicity for reading the first logic state and writing the second logic state is based at least in part on a temperature of a subsection of the memory array that includes the memory cell, an access rate associated with the memory cell, or a number of access operations performed on the memory cell, or any combination thereof.

An address monitor 750 may be used to keep track of which memory cells are storing inverted logic states. For instance, the address monitor 750 may update a value of a counter based at least in part on writing the second logic state, where the value of the counter is associated with an address used for accessing the memory cell. The value of the counter may be stored in a non-volatile latch. In some examples, address monitor 750 may be implemented as the counter itself. In some cases, a comparator 730 may compare the value of the counter with the address used for accessing the memory cell. The sense component manager 725 may use the comparison to determine to read the memory cell through the second set of transistors during a subsequent read operation (e.g., by determining the address is less than the value of the counter). Accordingly, the logic state identifier 755 may determine that the output of the sense component corresponds to the first logic state, despite the memory cell storing the second logic state.

In some examples, address selector 760 may select a first address corresponding to a plurality of memory cells that includes the memory cell, wherein the sense component is in electronic communication with the plurality of memory cells and may trigger sense component manager 725 to initiate a read operation. The read operation may include reading a logic state of each memory cell of the plurality of memory cells. After reading the plurality of memory cells, sense component manger 725 may trigger a write back operation that writes an opposite (inverted) logic state back to each of the memory cells. In some cases, isolation component 740 may cooperate with sense component manager 725 to cause the write back to be performed through the second set of transistors. After writing back the inverted logic states, the address monitor 750 may update a value of the counter to a first value equivalent to the first address. In this way, address monitor may keep track of which memory cells are storing inverted logic states (e.g., any memory cell associated with a lower address than the value of the counter may be determined to be storing an inverted logic state).

In some examples, address selector 760 may select a second value higher than the first value associated with a next address and corresponding to a second plurality of memory cells. Inversion component 765 may invert the logic states of the second plurality of memory cells based on the next address and address monitor 750 may increment the value of the counter to equal the second value. In another example, address selector 760 may select a second value lower than the first value associated with a next address and corresponding to a second plurality of memory cells based at least in part on the first address being a maximum address value. Inversion component 765 may invert logic states of the second plurality of memory cells based on the next address and address monitor 750 may decrement the value of the counter to equal the second value.

In a second example, comparator 730 may compare a first value of a counter with a second value associated with a first address of a plurality of memory cells (e.g., a page), where the first value of the counter is associated with a second address. In some examples, selection component 735 may select memory cells associated with the first address from the plurality of memory cells for a read operation. Sense component manager 725 may initiate a read operation to read a plurality of logic states from the plurality of memory cells using a first set of transistors or a second set of transistors based on the comparison. The first set of transistors and the second set of transistors are in electronic communication with a sense component and the plurality of memory cells and may be activated/deactivated using isolation component 740. For instance, inversion component 765 may determine to read an opposite logic state from the logic state stored by a memory cell of the plurality of memory cells based on the comparison (e.g., if the value associated with the first address is less than the value of the counter). Accordingly, sense component manager 725 and isolation component 740 may cooperate to read the opposite logic state of the logic state stored by the memory cell using the second set of transistors. Isolation component 740 may be used to activate the second set of transistors.

In some examples, the inversion component 765 inverts a second plurality of logic states corresponding to a second plurality of memory cells, and address monitor 750 update the first value of counter based at least in part on an address of the second plurality of memory cells. In some cases, the isolation component 740 activates the second set of transistors based on the comparison so that sense component manager 725 may read the plurality of logic states using the second set of transistors. In another example, sense component manager 725 may write a second plurality of logic states to the plurality of memory cells using the second set of transistors based on the comparison.

Figure 8:
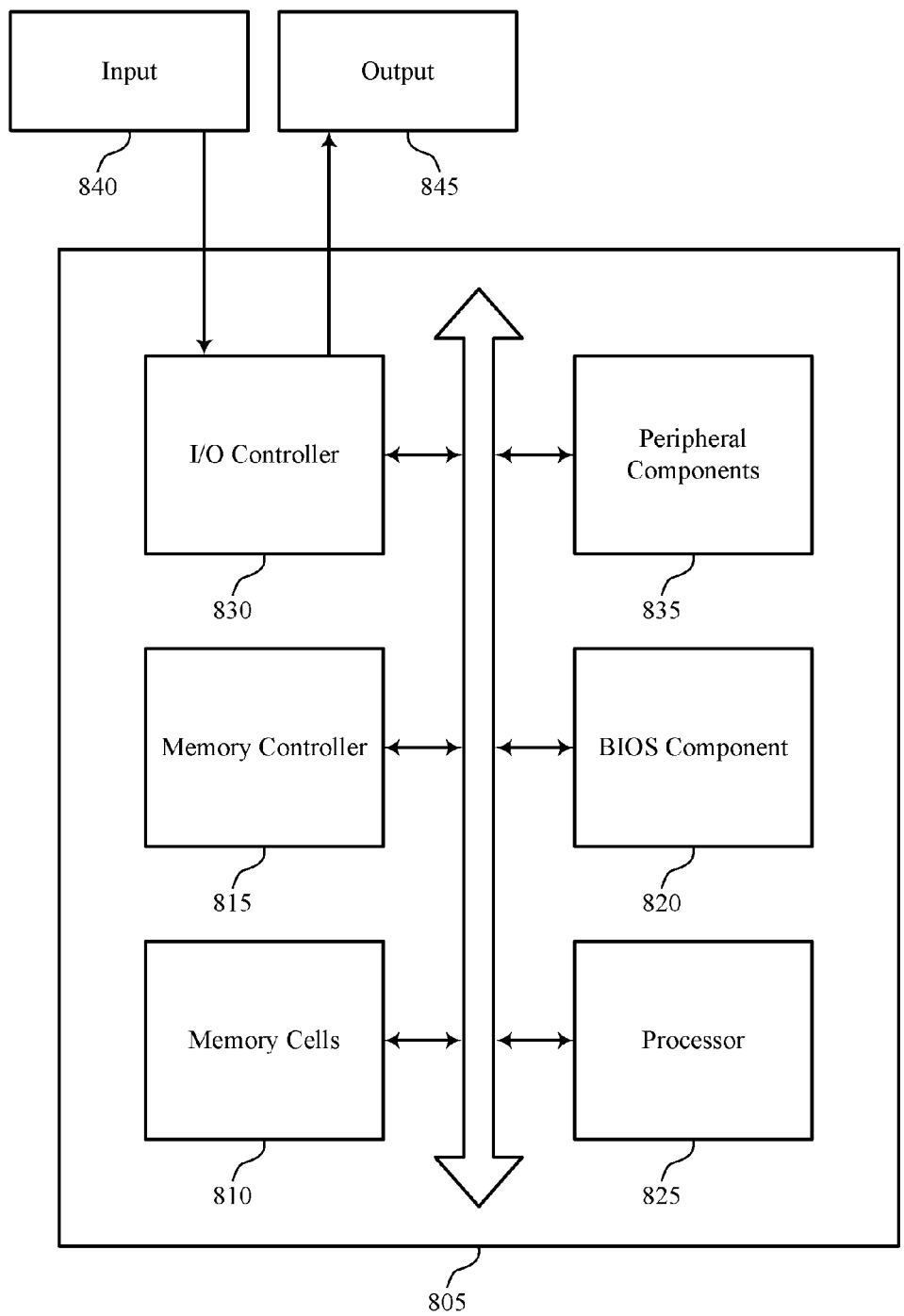
FIG. 8 illustrates a system, including a memory array, that supports the inversion of data bits in accordance with various embodiments of the present disclosure.

FIG. 8 shows a diagram of a system 800 including a device 805 that supports the inversion of data bits in accordance with various aspects of the present disclosure. Device 805 may be an example of or include the components of memory array 605, or a memory array 100 as described above, e.g., with reference to FIGS. 1, 5 and 6.

Device 805 may include components for bi-directional voice and data communications including components for transmitting and receiving communications, including memory cells 810, memory controller 815, BIOS component 820, processor 825, I/O controller 830, and peripheral components 835.

Memory controller 815 may operate one or more memory cells as described herein. Specifically, memory controller 815 may be configured to support array data bit inversion. In some cases, memory controller 815 may include a row decoder, column decoder, or both, as described with reference to FIG. 1 (not shown).

BIOS component 820 be a software component that includes a basic input/output system (BIOS) operated as firmware, which may initialize and run various hardware components. BIOS component 820 may also manage data flow between a processor and various other components, e.g., peripheral components, input/output control component, etc. BIOS component 820 may include a program or software stored in read-only memory (ROM), flash memory, or any other non-volatile memory.

Processor 825 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 825 may be configured to operate a memory array using a memory controller. In other cases, a memory controller may be integrated into the processor 825. Processor 825 may be configured to execute computer-readable instructions stored in a memory to perform various functions (e.g., function or tasks supporting array data bit inversion).825.

I/O controller 830 may manage input and output signals for device 805. Input/output control component 830 may also manage peripherals not integrated into device 805. In some cases, input/output control component 830 may represent a physical connection or port to the external peripheral. In some cases, I/O controller 830 may utilize an operating system such as iOS®, ANDROID®, MS-DOS®, MS-WINDOWS®, OS/2®, UNIX®, LINUX®, or another mobile or desktop operating system.

Peripheral components 835 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 840 may represent a device or signal external to device 805 that provides input to device 805 or its components. This may include a user interface or an interface with or between other devices. In some cases, input 840 may be managed by I/O controller 830, and may interact with device 805 via a peripheral component 835.

Output 845 may also represent a device or signal external to device 805 configured to receive output from device 805 or any of its components. Examples of output 845 may include a display, audio speakers, a printing device, another processor or printed circuit board, etc. In some cases, output 845 may be a peripheral element that interfaces with device 805 via peripheral component(s) 835. In some cases, output 845 may be managed by I/O controller 830.

The components of device 805 may include circuitry designed to carry out their functions. This may include various circuit elements, for example, conductive lines, transistors, capacitors, inductors, resistors, amplifiers, or other active or inactive elements, configured to carry out the functions described herein.

Figure 9:
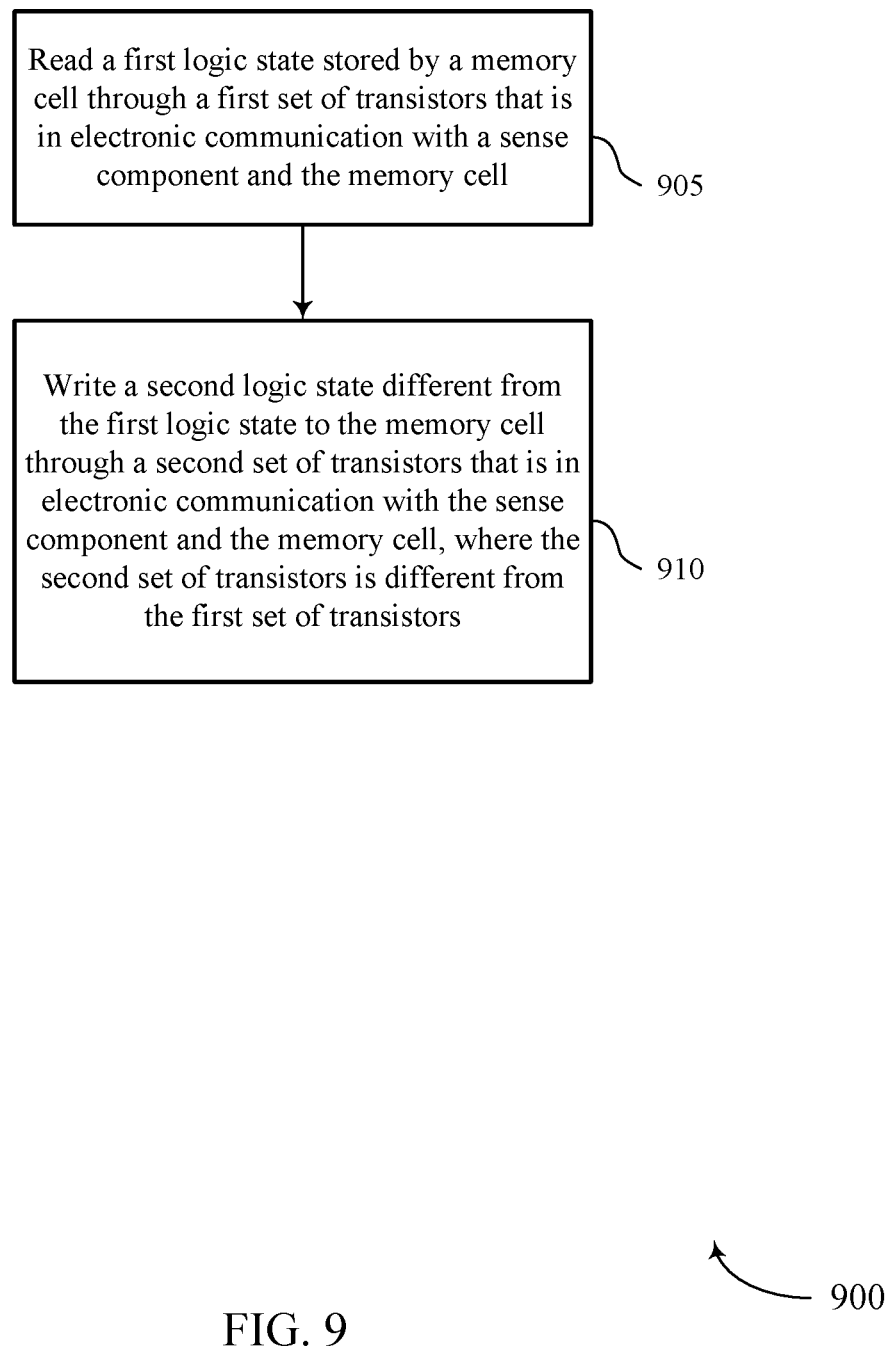
FIGS. 9-10 are flowcharts that illustrate a method or methods for the inversion of data bits in accordance with various embodiments of the present disclosure.

FIG. 9 shows a flowchart illustrating a method 900 for the inversion of data bits in accordance with various embodiments of the present disclosure. The operations of method 900 may be for operating a memory array 100, as described herein. For example, the operations of method 900 may be performed by a memory controller 140 as described with reference to FIGS. 1, 6, and 8. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the memory array 100 may read a first logic state stored by a memory cell through a first set of transistors that is in electronic communication with a sense component and the memory cell. The operations of block 905 may be performed according to the methods described with reference to FIGS. 1 through 5C. In certain examples, aspects of the operations of block 905 may be performed by a sense component manager as described with reference to FIGS. 6 and 8. Reading the first logic state may include discharging the memory cell via a digit line that is in electronic communication with the first set of transistors and the sense component, isolating the sense component from the memory cell; and activating the sense component after the isolating to compare a voltage of the digit line with a reference voltage. In some cases, the sense component may be isolated by deactivating the first set of transistors.

At block 910, the memory array 100 may write a second logic state different from the first logic state to the memory cell through a second set of transistors that is in electronic communication with the sense component and the memory cell, where the second set of transistors is different from the first set of transistors. The operations of block 910 may be performed according to the methods described with reference to FIGS. 1 through 5C. In certain examples, aspects of the operations of block 910 may be performed by a sense component manager as described with reference to FIGS. 6 and 8. Writing the second logic state may include activating the second set of transistors after the comparison at the sense component; and applying a resultant voltage of the sense component to the digit line, wherein the resultant voltage is based at least in part on a result of comparing the voltage of the digit line with the reference voltage.

In some examples, the method may include updating a value of a counter based at least in part on writing the second logic state, wherein the value of the counter is associated with an address used for accessing the memory cell. The value of the counter may be compared with the address used for accessing the memory cell, and subsequent read operation for the memory cell may be performed through the second set of transistors based at least in part on the comparison of the value of the counter with the address after writing the second logic state. In some cases, it may be determined that an output of the sense component corresponds to the first logic state when reading the memory cell storing the second logic state through the second set of transistors.

In some examples of the method, reading the first logic state and writing the second logic state may occur periodically. For instance, a periodicity for reading the first logic state and writing the second logic state is based at least in part on a temperature of a subsection of the memory array that includes the memory cell, an access rate associated with the memory cell, or a number of access operations performed on the memory cell, or any combination thereof.

In some examples, the method may include selecting a first address corresponding to a plurality of memory cells that includes the memory cell, where the sense component is in electronic communication with the plurality of memory cells. A logic state of each memory cell of the plurality of memory cells may be read through the first set of transistors that are in electronic communication with a sense component and the memory cell. And a logic state of memory cell of the plurality of memory cells may be written with an opposite logic state through the second set of transistors that is in electronic communication with the sense component and the memory cell.

In some examples, a value of the counter may be updated to a first value that is equivalent to the first address. In some examples, a second value higher than the first value and associated with a next address that corresponds to a second plurality of memory cells may be selected. The method may include inverting logic states of the second plurality of memory cells. After inverting the logic states, the method may include incrementing the value of the counter to equal the second value. In some examples, a second value lower than the first value and associated with a next address that corresponds to a second plurality of memory cells may be selected based at least in part on the first address being a maximum address value. The method may include inverting logic states of the second plurality of memory cells. After inverting the logic states, the method may include decrementing the value of the counter to equal the second value.

Figure 10:
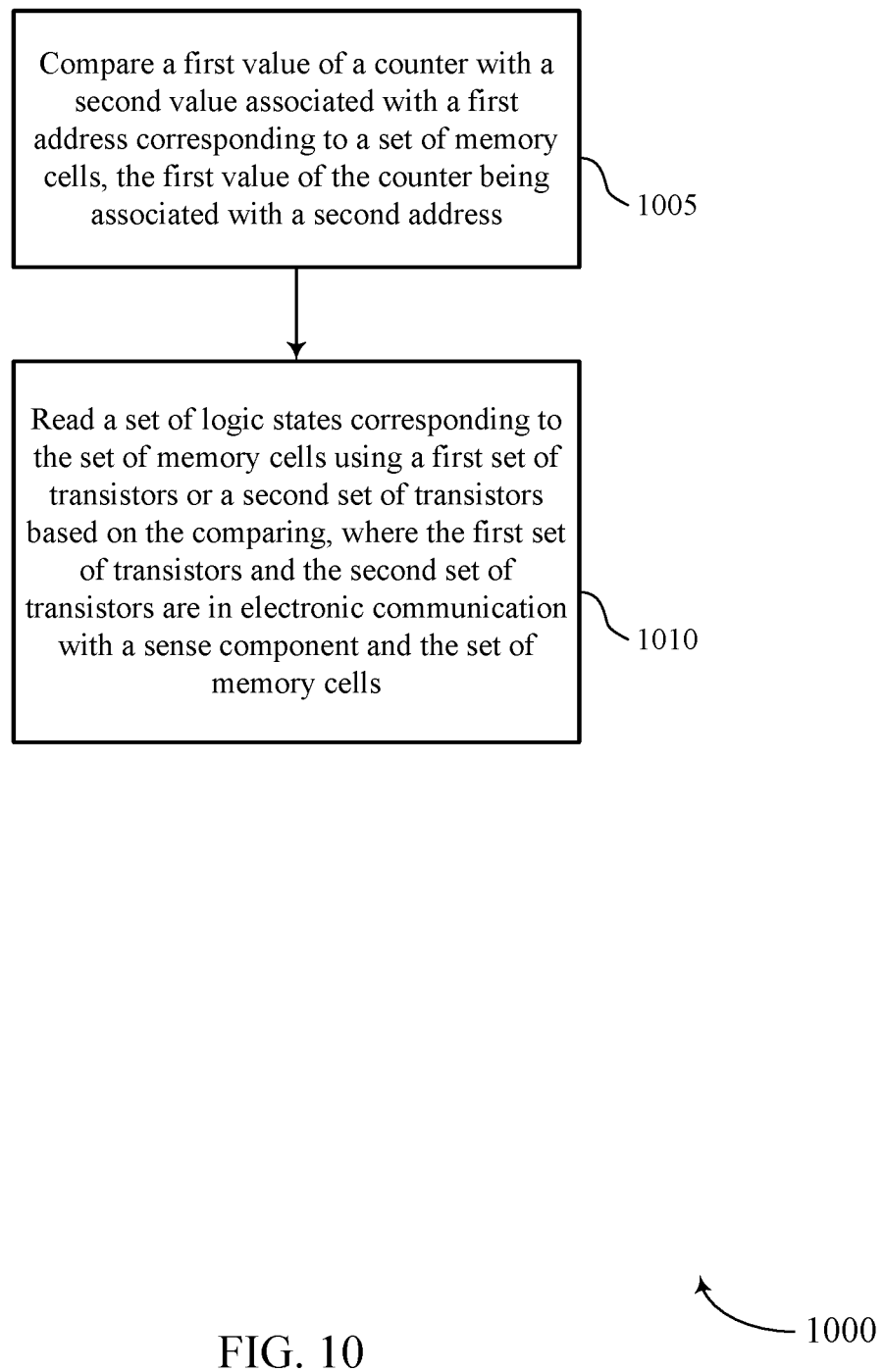

FIG. 10 shows a flowchart illustrating a method 1000 for the inversion of data bits in accordance with various embodiments of the present disclosure. The operations of method 1000 may be for operating a memory array 100, as described herein. For example, the operations of method 1000 may be performed by a memory controller 140 as described with reference to FIGS. 1, 6 and 8. In some examples, a memory array 100 may execute a set of codes to control the functional elements of the device to perform the functions described below. Additionally or alternatively, the memory array 100 may perform aspects the functions described below using special-purpose hardware.

At block 1005, the memory array 100 may compare a first value of a counter with a second value associated with a first address corresponding to a set of memory cells, the first value of the counter being associated with a second address. The operations of block 1005 may be performed according to the methods described with reference to FIGS. 1 through 5C. In certain examples, aspects of the operations of block 1005 may be performed by a comparator as described with reference to FIGS. 6 and 8. In some examples, the method may include selecting memory cells associated with the first address from the plurality of memory cells for a read operation.

At block 1010, the memory array 100 may read a set of logic states corresponding to the set of memory cells using a first set of transistors or a second set of transistors based on the comparing, where the first set of transistors and the second set of transistors are in electronic communication with a sense component and the set of memory cells. The operations of block 1010 may be performed according to the methods described with reference to FIGS. 1 through 5C. In certain examples, aspects of the operations of block 1010 may be performed by a sense component manager as described with reference to FIGS. 6 and 8. In some examples, the method may include determining to read an opposite logic state from that stored by a memory cell of the plurality of memory cells based at least in part on the comparing; and the opposite logic state stored by the memory cell may be read using the second set of transistors.

In some cases, the method may include inverting a second plurality of logic states corresponding to a second plurality of memory cells and updating the first value of the counter based at least in part on an address of the second plurality of memory cells. In some examples, a first value of the counter may be determined to be greater than or equal to the second value associated with the first address and the plurality of logic states may be read using the second set of transistors based at least in part on the determining. In some examples, the first value of the counter is determined to be greater than or equal to the second value associated with the first address; and a second plurality of logic states is written to the memory cell using the second set of transistors based at least in part on the determining.

Thus, methods 900 and 1000 may provide for inversion of data bits in an array. It should be noted that methods 900 and 1000 describe possible implementations, and the operations and steps may be rearranged or otherwise modified such that other implementations are possible. In some examples, features from two or more of the methods 900 and 1000 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method for operating a memory array, comprising:
    reading a first logic state stored by a memory cell through a first set of transistors that is in electronic communication with a sense component and the memory cell, wherein reading the first logic state comprises:
        discharging the memory cell via a digit line that is in electronic communication with the first set of transistors and the sense component;
        isolating the sense component from the memory cell; and
        activating the sense component after the isolating to compare a voltage of the digit line with a reference voltage; and
    writing a second logic state different from the first logic state to the memory cell through a second set of transistors that is in electronic communication with the sense component and the memory cell, wherein the second set of transistors is different from the first set of transistors.

2. The method of claim 1, wherein isolating the sense component comprises deactivating the first set of transistors.

3. The method of claim 1, wherein writing the second logic state comprises:
    activating the second set of transistors after the comparison at the sense component; and
    applying a resultant voltage of the sense component to the digit line, wherein the resultant voltage is based at least in part on a result of comparing the voltage of the digit line with the reference voltage.

4. The method of claim 1, wherein reading the first logic state and writing the second logic state is periodic.

5. The method of claim 4, wherein a periodicity for reading the first logic state and writing the second logic state is based at least in part on a temperature of a subsection of the memory array that includes the memory cell, an access rate associated with the memory cell, or a number of access operations performed on the memory cell, or any combination thereof.

6. A method for operating a memory array, comprising:
    reading a first logic state stored by a memory cell through a first set of transistors that is in electronic communication with a sense component and the memory cell;
    writing a second logic state different from the first logic state to the memory cell through a second set of transistors that is in electronic communication with the sense component and the memory cell, wherein the second set of transistors is different from the first set of transistors; and
    updating a value of a counter based at least in part on writing the second logic state, wherein the value of the counter is associated with an address used for accessing the memory cell.

7. The method of claim 6, further comprising:
    comparing the value of the counter with the address used for accessing the memory cell;
    reading the memory cell through the second set of transistors based at least in part on the comparison of the value of the counter with the address after writing the second logic state; and
    determining an output of the sense component corresponds to the first logic state.

8. A method for operating a memory array, comprising:
    selecting a first address corresponding to a plurality of memory cells that includes a memory cell, wherein a sense component is in electronic communication with the plurality of memory cells;
    reading a first logic state stored by the memory cell through a first set of transistors that is in electronic communication with the sense component and the memory cell;
    writing a second logic state different from the first logic state to the memory cell through a second set of transistors that is in electronic communication with the sense component and the memory cell, wherein the second set of transistors is different from the first set of transistors,
    wherein the reading comprises reading a logic state of each memory cell of the plurality of memory cells, and
    wherein the writing comprises writing an opposite logic state to each memory cell of the plurality of memory cells.

9. The method of claim 8, further comprising:
    updating a value of a counter to a first value equivalent to the first address.

10. The method of claim 9, further comprising:
    selecting a second value higher than the first value associated with a next address and corresponding to a second plurality of memory cells;
    inverting logic states of the second plurality of memory cells; and
    incrementing the value of the counter to equal the second value.

11. The method of claim 9, further comprising:
    selecting a second value lower than the first value associated with a next address and corresponding to a second plurality of memory cells based at least in part on the first address being a maximum address value;
    inverting logic states of the second plurality of memory cells; and
    decrementing the value of the counter to equal the second value.

12. A method for operating a memory array, comprising:
    comparing a first value of a counter with a second value associated with a first address corresponding to a plurality of memory cells, the first value of the counter being associated with a second address; and reading a plurality of logic states corresponding to the plurality of memory cells using a first set of transistors or a second set of transistors based at least in part on the comparing, wherein the first set of transistors and the second set of transistors are in electronic communication with a sense component and the plurality of memory cells.

13. The method of claim 12, further comprising:
selecting memory cells associated with the first address from the plurality of memory cells for a read operation.

14. The method of claim 12, further comprising:
determining to read an opposite logic state from that stored by a memory cell of the plurality of memory cells based at least in part on the comparing; and reading the opposite logic state stored by the memory cell using the second set of transistors.

15. The method of claim 12, further comprising:
inverting a second plurality of logic states corresponding to a second plurality of memory cells;

updating the first value of the counter based at least in part on an address of the second plurality of memory cells.

16. The method of claim 15, further comprising:
determining the first value of the counter is greater than or equal to the second value associated with the first address, wherein reading the plurality of logic states comprises using the second set of transistors based at least in part on the determining.

17. The method of claim 15, further comprising:
determining the first value of the counter is greater than or equal to the second value associated with the first address; and writing a second plurality of logic states using the second set of transistors based at least in part on the determining.

18. An apparatus, comprising:
a first ferroelectric memory cell;
a reference line;
a sense component in electronic communication with the first ferroelectric memory cell and the reference line;
a first set of transistors in electronic communication with the first ferroelectric memory cell, the reference line, and the sense component, the first set of transistors having a first configuration with respect to the sense component;
a second set of transistors in electronic communication with the first ferroelectric memory cell, the reference line, and the sense component, the second set of transistors having a second configuration with respect to the sense component; and
a counter associated with an address of a plurality of memory cells storing inverted logic states.

19. The apparatus of claim 18, further comprising:
a first set of control lines in electronic communication with the first set of transistors; and
a second set of control lines in electronic communication with the second set of transistors.

20. The apparatus of claim 18, further comprising:
a non-volatile latch operable to store a value of the counter.

21. The apparatus of claim 20, wherein the non-volatile latch comprises a third ferroelectric memory cell.

22. The apparatus of claim 18, further comprising:
a comparator that has a first input to receive a first value of the counter and a second input to receive a second value of a second address used for accessing a second plurality of memory cells.

23. An apparatus, comprising:
a first ferroelectric memory cell;
a reference line;
a sense component in electronic communication with the first ferroelectric memory cell and the reference line;
a first set of transistors in electronic communication with the first ferroelectric memory cell, the reference line, and the sense component, the first set of transistors having a first configuration with respect to the sense component, wherein the first set of transistors is configured so that a first transistor of the first set of transistors is in electronic communication with a first input of the sense component and a digit line, and a second transistor of the first set of transistors is in electronic communication with a second input of the sense component and the reference line; and
a second set of transistors in electronic communication with the first ferroelectric memory cell, the reference line, and the sense component, the second set of transistors having a second configuration with respect to the sense component, wherein the second set of transistors is configured so that a first transistor of the second set of transistors is in electronic communication with the second input of the sense component and the digit line, and a second transistor of the second set of transistors is in electronic communication with the first input of the sense component and the reference line.

* * * * *